(12) United States Patent
Khusnatdinov et al.

(10) Patent No.: US 11,590,687 B2
(45) Date of Patent: Feb. 28, 2023

(54) SYSTEMS AND METHODS FOR REDUCING PRESSURE WHILE SHAPING A FILM

(71) Applicant: CANON KABUSHIKI KAISHA, Tokyo (JP)

(72) Inventors: Niyaz Khusnatdinov, Round Rock, TX (US); Mario Johannes Meissl, Austin, TX (US); Seth J. Bamesberger, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/946,628

(22) Filed: Jun. 30, 2020

(65) Prior Publication Data
US 2021/0402677 A1 Dec. 30, 2021

(51) Int. Cl.
*B29C 59/00* (2006.01)
*B29C 59/02* (2006.01)

(52) U.S. Cl.
CPC .......... *B29C 59/022* (2013.01); *B29C 59/002* (2013.01)

(58) Field of Classification Search
CPC ..... B29C 59/022; B29C 59/002; B29C 59/00; B29C 35/08; B29C 43/00; G03F 7/00; G03F 7/033; B29L 2031/00
See application file for complete search history.

(56) References Cited

U.S. PATENT DOCUMENTS

| | | | |
|---|---|---|---|
| 6,900,881 B2 | 5/2005 | Sreenivasan et al. | |
| 6,936,194 B2 | 8/2005 | Watts | |
| 7,090,716 B2 | 8/2006 | McMackin et al. | |
| 7,316,554 B2 | 1/2008 | Choi et al. | |
| 7,322,287 B2 | 1/2008 | Tan et al. | |
| 7,462,028 B2 | 12/2008 | Cherala et al. | |
| 7,670,534 B2 | 3/2010 | Choi et al. | |
| 7,691,313 B2 | 4/2010 | Choi et al. | |
| 7,931,846 B2 | 4/2011 | Choi et al. | |
| 8,066,930 B2 | 11/2011 | Sreenivasan et al. | |
| 8,282,383 B2 | 10/2012 | Choi et al. | |
| 8,349,241 B2 | 1/2013 | Sreenivasan et al. | |
| 8,945,444 B2 | 2/2015 | Lu et al. | |
| 9,090,014 B2 | 7/2015 | Lu et al. | |
| 9,533,445 B2 | 1/2017 | Zhang et al. | |
| 9,950,463 B2 | 4/2018 | Ishikawa et al. | |
| 10,569,449 B1* | 2/2020 | Curts | B29C 59/022 |
| 2007/0262049 A1 | 11/2007 | Miyajima et al. | |
| 2008/0029931 A1 | 2/2008 | Tada et al. | |
| 2008/0213418 A1 | 9/2008 | Tan et al. | |
| 2011/0193251 A1 | 8/2011 | Jain et al. | |
| 2014/0008841 A1 | 1/2014 | Choi et al. | |
| 2014/0239529 A1 | 8/2014 | Tan et al. | |
| 2017/0282439 A1* | 10/2017 | Lu | G03F 7/707 |

(Continued)

FOREIGN PATENT DOCUMENTS

WO 2014/076922 A1 5/2014

*Primary Examiner* — Jeffrey M Wollschlager
*Assistant Examiner* — Shibin Liang
(74) *Attorney, Agent, or Firm* — Daniel Ratoff

(57) ABSTRACT

Systems and methods of shaping a patterned or planarized film layer. Which may include contacting formable material on a substrate with a template during a contacting period, Which may also include reducing, during the contacting period, a pressure in an environment beyond an edge of the substrate from a first pressure to a second pressure, while the template is contacting the formable material.

13 Claims, 11 Drawing Sheets

(56) References Cited

U.S. PATENT DOCUMENTS

| | | |
|---|---|---|
| 2019/0080922 A1 | 3/2019 | Khusnatdinov et al. |
| 2019/0263032 A1 | 8/2019 | Tan et al. |
| 2019/0294040 A1 | 9/2019 | Tan et al. |
| 2020/0142299 A1 | 5/2020 | Norikane |
| 2020/0193251 A1 | 6/2020 | Ellis |

* cited by examiner

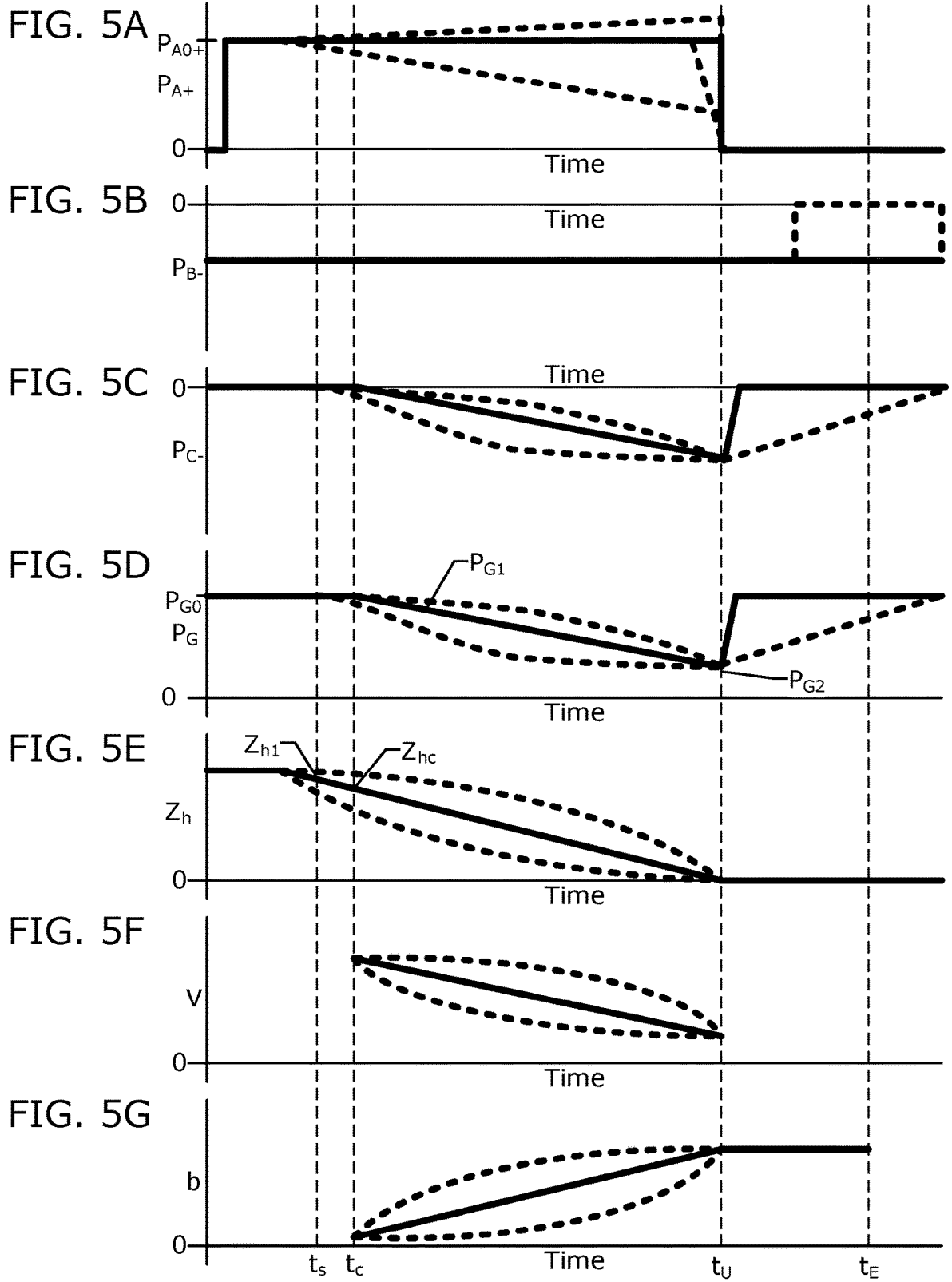

SYSTEMS AND METHODS FOR REDUCING PRESSURE WHILE SHAPING A FILM

BACKGROUND OF INVENTION

Technical Field

The present disclosure relates to systems and methods for shaping a film on a substrate with a shaping surface. In particular for controlling the gas environment at the edge of the substrate while the film is being shaped.

Description of the Related Art

Substrates can be processed using a variety of techniques which can be broadly divided into: step and repeat processes; scanning processes; and whole substrate processes. A step and repeat process in the present context is a process that is repeatedly applied to subsets of the substrate until the whole substrate is processed. A whole substrate process in the present context is a process that is applied to the entire substrate at one time. A scanning process in the present context is a process in which a beam is scanned across the substrate either for gathering information of about the substrate or modifying the substrate.

Nanoimprint lithography may be performed as a step and repeat process or as a whole substrate process. Exemplary nanoimprint lithography systems and processes are described in detail in numerous publications, such as U.S. Pat. Nos. 8,349,241, 8,066,930, and 6,936,194, all of which are hereby incorporated by reference herein. Nanoimprint lithography is useful for the fabrication of various devices in a variety of applications including, for example, fabricating one or more layers of integrated devices by shaping a layer on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like.

The nanoimprint lithography technique is used to shape a layer on a substrate by the formation of a relief pattern (shape on the order of 100 nm or less) in a formable material (polymerizable) layer. The shape of this layer may then be used to transfer a pattern corresponding to the relief pattern into and/or onto an underlying substrate. The shaped layer may also be a functional layer which is not transferred into the underlaying substrate.

US Patent Publication No. 2019/0080922 which is hereby incorporated by reference describes an Inkjet-based adaptive planarization (IAP) process. IAP may be performed as a step and repeat process or as a whole substrate process. IAP involves dispensing a drop pattern of formable material onto a substrate. A superstrate is then brought into contact with the drop pattern. The formable material between the superstrate and the substrate is then cured. The superstrate is then removed. The cured formable material takes on the shape of superstrate.

IAP is useful for the fabrication of various devices including but not limited to: semiconductor devices; optical devices; and biotechnology devices. For example, the process for creating a semiconductor device includes repeatedly adding and removing material to and from a substrate. This process can produce a layered substrate with irregular height variations (i.e., topography). As more layers are added the substrate height variation can increase. This height variation has a negative impact on the quality of further layers added to the substrate. In addition, there are limits to the flatness that is obtainable with reasonable costs on an unpatterned substrate (e.g., silicon wafers).

One method of addressing this issue is to planarize the substrate between layering steps. Various lithographic patterning methods benefit from patterning on a planar surface. For example, better planarization can improve one or more of: depth of focus (DOF), critical dimension (CD), CD uniformity; feature placement; nanoimprint feature filling; and pattern transfer. There are occasions when planarization is desired on a first length scale (for example 100 nm, 1 µm, 10 µm, 100 µm) while specific top surface variations are desired on a length scale larger than the first length scale (for example, more than 100 µm).

The substrate and the cured formable material may then be subjected to known steps and processes for device (article) fabrication, including but not limited to: imprint lithography; photolithography; baking; oxidation; layer formation; deposition; doping; etching; descumming; dicing; bonding; packaging; etc.

SUMMARY OF THE INVENTION

A first embodiment, may be a method that includes contacting formable material on a substrate with a template during a contacting period, The method may also include reducing, during the contacting period, a pressure in an environment the substrate and the template from a first pressure to a second pressure, while the template is contacting the formable material.

In an aspect of the first embodiment, during the contacting period an advancing contact line with a contact line velocity may be formed. Also during the contacting period, the advancing contact line may be at the intersection of the formable material and the template. Also during the contacting period, the gas is expelled from the region between the template and the substrate at a gas velocity that is greater than the contact line velocity when the pressure in the environment is the second pressure.

In an aspect of the first embodiment, the gas velocity may be greater than the contact line velocity during the contact period.

The first embodiment may further comprise, depositing the formable material onto the substrate.

The first embodiment may further comprise, depositing formable material onto the substrate as a plurality of droplets.

In an aspect of the first embodiment, the formable material may be a polymerizable fluid.

In an aspect of the first embodiment, the template may be a superstrate with a shaping surface, and a shaping area of the superstrate is greater than or equal to a device-yielding area of the substrate.

In an aspect of the first embodiment, the film layer may be a planarization layer and the superstrate may be featureless.

In an aspect of the first embodiment, a shaping area of the template may be less than a device-yielding area of the substrate.

The first embodiment may further comprise, solidifying the formable material into the film layer on the substrate by exposing the formable material under the template to actinic radiation. The first embodiment may further comprise, separating the template from the film layer.

The first embodiment may also be a method of manufacturing articles. The method of manufacturing articles may include using the method of shaping the film layer. The method of manufacturing articles may further comprise processing the substrate on which the film layer is produced so as to manufacture the articles.

A second embodiment, may be a system for shaping films on a substrate. The system may include a substrate chuck configured to hold the substrate. The system may include a template chuck configured to hold and distort a template. The system may include a dispenser configured to dispense a formable material onto the substrate. The system may include a positioning system configured to move the substrate chuck relative to the template chuck. The system may include an actinic radiation source. The system may include a gas controller. The system may include a memory. The system may include a processor. The processor may be configured to send instructions to the template chuck and the positioning system to contact the formable material on the substrate with the template during a contacting period. The processor may be configured to send instructions to the gas controller to reduce, during the contacting period, a pressure in an environment between the substrate and the template from a first pressure to a second pressure, while the template is contacting the formable material.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIGS. 5A-G are timing charts showing variation of various parameters during the imprinting process.

Figure 1A:
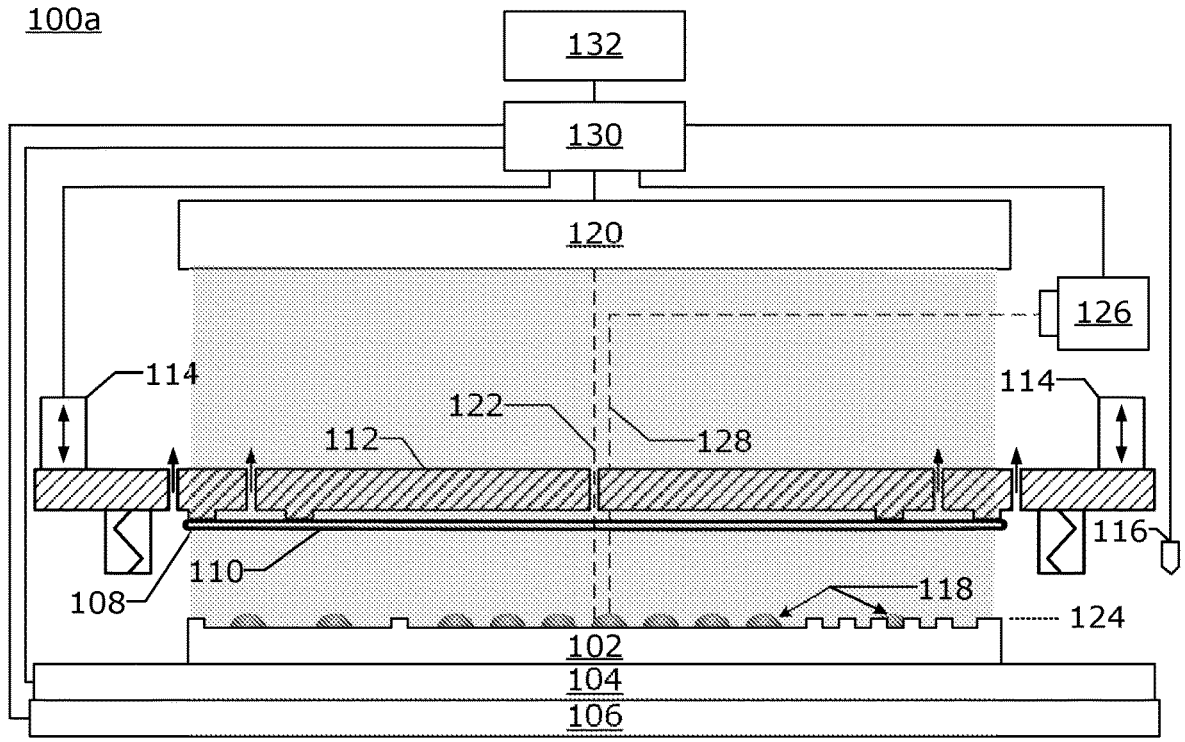
FIG. 1A is an illustration of an exemplary adaptive planarization system having a superstrate spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The inkjet-based adaptive planarization and nanoimprint lithography processes are shaping processes that are used to shape a layer on a substrate from a formable material. These shaping processes include: dispensing formable material onto a substrate; bringing a shaping surface (for example a superstrate, a template, etc.) into contact with the formable material; curing the formable material while the superstrate is in contact with the formable material; and separating the shaping surface from the cured formable material.

As the shaping surface is brought into contact with the formable material the formable material spreads. The spreading formable material fills the space between the shaping surface and the substrate; and pushes out gas that is between the formable material and the shaping surface. The quality (defect density) of the shaped surface depends on spreading the formable material in a controlled manner. The spreading of the formable material in a manner that produces a quality shaped film can also be a throughput limiting step. What is needed is a formable material spreading process which produces a high quality shaped surface and is fast.

Shaping System

FIG. 1A is an illustration of a shaping system $100a$ in which an embodiment may be implemented. The shaping system $100a$ is used to produce a shaped film layer on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a superstrate 108. The superstrate 108 has a shaping surface 110 on the front side of the superstrate 108. The shaping surface 110 may be planar in which case it is used to planarize the formable material 118.

Superstrate 108 may be coupled to a superstrate chuck 112. In an embodiment the superstrate chuck 112 is a multizone chuck. The superstrate chuck 112 may be, but is not limited to: vacuum chuck, pin-type chuck, groove-type chuck, electrostatic chuck, electromagnetic chuck, and/or other similar chuck types. The superstrate chuck 112 may be configured to apply one or more of: stress; pressure; and strain to superstrate 108, that varies across the superstrate 108. The superstrate chuck 112 may include a system such as a vacuum system, an actuator array, a pressure bladder, etc. which can apply a pressure differential to a back surface of the superstrate 108 causing the superstrate 108 to bend and deform. The superstrate chuck 112 may be substantially transparent to actinic radiation.

The superstrate chuck 112 may be coupled to a positioning head 114 which is a part of the positioning system. The positioning head 114 may be moveably coupled to a bridge (not shown). The positioning head 114 may include one or more actuators such as voice coil motors, piezoelectric motors, linear motor, nut and screw motor, etc., which are configured to move the superstrate chuck 112 relative to the substrate in at least the z-axis direction, and potentially other directions (e.g. x, y, θ, ψ, and φ-axes).

The shaping system 100a may further comprise a fluid dispenser 116. The fluid dispenser 116 may also be affixed moveably coupled to the bridge or affixed to a positioning component that is also affixed to the bridge. In an embodiment, the fluid dispenser 116 and the superstrate positioning head 114 share one or more or all positioning components. In an alternative embodiment, the fluid dispenser 116 and the superstrate positioning head 114 move independently from each other. The fluid dispenser 116 may be used to deposit liquid formable material 118 (e.g., polymerizable material) onto the substrate 102 in a pattern. Additional formable material 118 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 118 being deposited onto the substrate 102. The formable material 118 may be dispensed upon the substrate 102 before and/or after a desired volume is defined between the shaping surface 110 and the substrate surface 124 depending on design considerations. The formable material 118 may comprise a mixture including a monomer as described in U.S. Pat. Nos. 7,157,036 and 8,076,386, both of which are herein incorporated by reference.

Different fluid dispensers 116 may use different technologies to dispense formable material 118. When the formable material 118 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100a may further comprise a curing system. The curing system induces a phase change in the liquid formable material into a solid material whose top surface is determined by the shape of the shaping surface. The curing system may supply energy to the formable material inducing the phase change. The curing system may include at least a radiation source 120 that directs actinic energy towards the formable material 118 under the superstrate 108 along an exposure path. In an embodiment, the actinic energy may be directed through the superstrate 108 towards the formable material 118 under the superstrate 108. In an embodiment, the actinic energy produced by the radiation source 120 is UV light that induces polymerization of monomers in the formable material 118. In an alternative embodiment, the actinic energy may be directed through both the superstrate chuck 112 and superstrate 108 towards the formable material 118 under the superstrate 108.

The superstrate positioning head 114 and the substrate positioning stage 106 may be configured to position the superstrate 108 and the substrate 102 in superimposition with the exposure path 122. The radiation source 120 sends the actinic energy along the exposure path 122 after the superstrate 108 has contacted the formable material 118. FIG. 1A illustrates the principal axis of the exposure path 122 when the superstrate 108 is not in contact with the formable material 118, this is done for illustrative purposes so that the relative position of the individual components can be easily identified. An individual skilled in the art would understand that exposure path 122 would not substantially change when the superstrate 108 is brought into contact with the formable material 118. The radiation source 120 may include one or more radiation sources. The radiation source 120 may include and/or may be optically connected to a plurality optical of components that guide, filter, and shape the actinic radiation that is incident on the formable material 118. The plurality of optical components may include but are not limited to one or more of: lenses; mirrors; filters; apertures; spatial light modulators; adaptive optics; beam splitters; beam combiners; prisms; etc.

The shaping system 100a may further comprise a spread camera 126 that is positioned to view the spread of formable material 118 after the superstrate 108 has made contact with the formable material 118. FIG. 1A illustrates an optical axis 128 of the field camera's imaging field as a dashed line. As illustrated in FIG. 1A the shaping system 100a may include one or more optical components (dichroic mirrors, beam combiners, prisms, lenses, mirrors, etc.) along the optical axis 128 which combine the actinic radiation from the exposure path 122 with light to be detected by the spread camera 126. The spread camera 126 may be configured to detect the spread of formable material under the superstrate 108. The optical axis 128 of the spread camera 126 as illustrated in FIG. 1A may be bent by one or more optical components or may be straight. The spread camera 126 may include one or more of a CCD, a sensor array, a line camera, a plurality of CCDs, and a photodetector which are configured to gather light that has a wavelength that shows a contrast between regions underneath the superstrate 108 that are in contact with the formable material, and regions underneath the superstrate 108 which are not in contact with the formable material 118. The spread camera 126 may be configured to gather monochromatic images of visible light. The spread camera 126 may be configured to provide images of the spread of formable material 118 underneath the superstrate 108; the separation of the superstrate 108 from cured formable material; and can be used to keep track of the shaping process. The spread camera 126 may also be configured to measure interference fringes, which change as the formable material 118 spreads between the gap between the shaping surface 110 and the substrate surface 124.

The shaping system 100a may further comprise a droplet inspection system (not shown) that is separate from the spread camera 126. The droplet inspection system may include one or more of a CCD, a camera, a line camera, and a photodetector. The droplet inspection system may include one or more optical components such as a lenses, mirrors, apertures, filters, prisms, polarizers, windows, adaptive optics, and/or light sources. The droplet inspection system may be positioned to inspect droplets prior to the shaping surface 110 contacting the formable material 118 on the substrate 102. In an alternative embodiment, the spread camera 126 is used to inspect the droplets.

The shaping system 100a may further include a thermal radiation source (not shown) which may be configured to provide a spatial distribution of thermal radiation to one or both of the superstrate 108 and the substrate 102. The thermal radiation source may include one or more sources of thermal electromagnetic radiation that will heat up one or both of the substrate 102 and the superstrate 108 and does not cause the formable material 118 to solidify. The thermal radiation source may include a spatial light modulator such as a digital micromirror device (DMD), Liquid Crystal on Silicon (LCoS), Liquid Crystal Device (LCD), etc., to modulate the spatio-temporal distribution of thermal radiation. The shaping system 100a may further comprise one or more optical components which are used to combine the actinic radiation, the thermal radiation, and the radiation gathered by the spread camera 126 onto a single optical path when the superstrate 108 comes into contact with the formable material 118 on the substrate 102. The thermal radiation source may send the thermal radiation along a thermal radiation path after the superstrate 108 has contacted the formable material 118.

Prior to the formable material 118 being dispensed onto the substrate, a substrate coating (not shown) may be applied to the substrate 102. In an embodiment, the substrate coating may be an adhesion layer. In an embodiment, the substrate coating may be applied to the substrate 102 prior to the substrate being loaded onto the substrate chuck 104. In an alternative embodiment, the substrate coating may be applied to substrate 102 while the substrate 102 is on the substrate chuck 104. In an embodiment, the substrate coating may be applied by spin coating, dip coating, drop dispense, slot dispense, etc. In an embodiment, the substrate 102 may be a semiconductor wafer.

The shaping system 100a may include an atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the atmosphere by controlling the flow of gas at the edge of the substrate 102.

The shaping system 100a may be regulated, controlled, and/or directed by one or more processors 130 (controller) in communication with one or more components and/or subsystems such as the substrate chuck 104, the substrate positioning stage 106, the superstrate chuck 112, the superstrate positioning head 114, the fluid dispenser 116, the radiation source 120, the thermal radiation source, the spread camera 126, imprint field atmosphere control system, and/or the droplet inspection system. The processor 130 may operate based on instructions in a computer readable program stored in a non-transitory computer readable memory 132. The processor 130 may be or include one or more of a CPU, MPU, GPU, ASIC, FPGA, DSP, and a general-purpose computer. The processor 130 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 130 may include a plurality of processors that are both included in the shaping system 100a and in communication with the shaping system 100a.

Either the superstrate positioning head 114, the substrate positioning stage 106, or both varies a distance between the shaping surface 110 and the substrate 102 to define a desired space (a bounded physical extent in three dimensions) that is filled with the formable material 118. For example, the superstrate positioning head 114 may apply a force to the superstrate 108 such that the shaping surface 110 is in contact with the formable material 118. After the desired volume is filled with the formable material 118, the radiation source 120 produces actinic radiation (e.g. UV, 248 nm, 280 nm, 350 nm, 365 nm, 395 nm, 400 nm, 405 nm, 435 nm, etc.) causing formable material 118 to cure (solidify, and/or cross-link); conforming to a shape of the substrate surface 124 and the shaping surface 110, defining a layer on the substrate 102. The formable material 118 is cured while the superstrate 108 is in contact with formable material 118, forming the layer on the substrate 102.

The cured layer may be formed such that it has a residual layer having a top layer thickness (TLT) that is a minimum thickness of formable material 118 between the substrate surface 124 and the shaping surface 110 in and across the planarization area of the substrate. The shaping system 100a is thus used for shaping films on the substrate such as the cured layer. The cured layer may be a planarization layer or a patterned layer.

Superstrate

In an embodiment, the superstrate 108 is substantially transparent to actinic radiation provided by the radiation source 120. In the present context, substantially transparent means greater than 90%. In an embodiment, the area of the shaping surface 110 is equal to or greater than an article yielding area of the substrate. The shaping surface 110 may include an edge treatment which includes a recessed area surrounding the shaping surface 110.

The superstrate 108 may be formed from such materials including, but not limited to: fused silica; quartz; silicon; organic polymers; siloxane polymers; borosilicate glass; fluorocarbon polymers; metal; hardened sapphire; and/or the like. In an embodiment, the shaping surface 110 may have a limited number of recesses or protrusions which do not impact the primary purpose of the superstrate which is to obtain a primarily planar top surface of the formable material.

In an embodiment, the shaping surface 110 may be inset from an outer edge of the superstrate by 0.1, 1, 3, 4, 5 mm, or more. In an embodiment, an average thickness of the superstrate may be: 2, 1, 0.9, 0.8, 0.7, 0.6, 0.5, 0.4, 0.3, 0.1, or 0.05 mm or less.

In an embodiment, the shaping surface 110 may have a surface roughness (Ra) or 100, 10, 1, 0.5, 0.2, 0.1 nm or less.

Shaping Process

Figure 2:
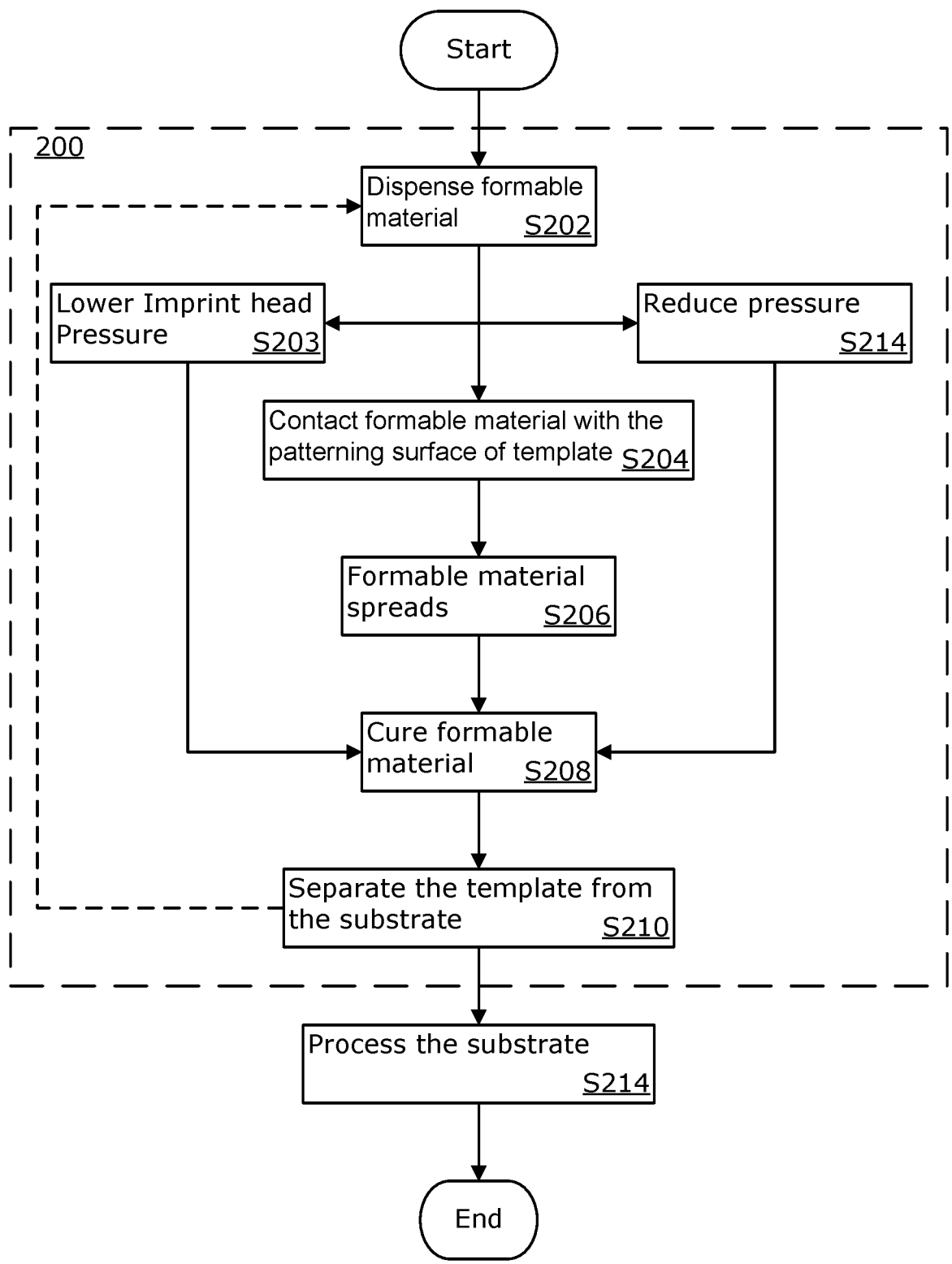
FIG. 2 is a flowchart illustrating an exemplary imprinting method as used in an embodiment.

FIG. 2 is a flowchart of a method of manufacturing an article (device) that includes a shaping process 200 by the shaping system 100a that can be used to shape the formable material 118 on the substrate. The shaping process 200 may be performed repeatedly on a plurality of substrates 102 by the shaping system 100a. The processor 130 may be used to control the shaping process 200. The shaping process 200 may be used to planarize the substrate 102. The shaping process may be a method of shaping a film layer. The film layer may be a planarization layer or a patterned layer.

The beginning of the shaping process 200 may include a superstrate mounting step causing a superstrate conveyance mechanism to mount a superstrate 108 onto the superstrate chuck 112. The shaping process may also include a substrate mounting step, the processor 130 may cause a substrate conveyance mechanism to mount the substrate 102 onto the substrate chuck 104. The substrate 102 may have one or more coatings and/or structures. The order in which the superstrate 108 and the substrate 102 are mounted onto the shaping system 100a is not particularly limited, and the superstrate 108 and the substrate 102 may be mounted sequentially or simultaneously. A single superstrate 108 may be used to shape formable material on a plurality of substrates.

In a positioning step, the processor 130 may cause one or both of the substrate positioning stage 106 and/or a dispenser positioning stage to move the substrate 102 relative to a fluid dispense position below the fluid dispenser 116. In a dispensing step S202, the processor 130 may cause the fluid dispenser 116 to dispense formable material onto the substrate 102. In an embodiment, the fluid dispenser 116 dispenses the formable material 118 as a plurality of droplets. The fluid dispenser 116 may include one nozzle or multiple nozzles. The fluid dispenser 116 may eject formable material 118 from the one or more nozzles simultaneously. The substrate may be moved relative to the fluid dispenser 116 while the fluid dispenser is ejecting formable material 118. In an embodiment, during the dispensing step S202, the formable material 118 may be dispensed onto a substrate in accordance with drop pattern received from the processor 130 and stored in the memory 132. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets. In an embodiment, the droplets are dispensed onto the substrate 102, prior to the substrate 102 being mounted onto the substrate chuck 112.

After, the droplets are dispensed, in an additional positioning step, the processor 130 may cause one or both of the substrate positioning stage 106 and/or a superstrate positioning stage to move the substrate 102 relative to the superstrate. During step S203 the imprint head 114 lowers the superstrate chuck and pressure is applied to the back surface of the superstrate bowing out the superstrate, this is done over a period time as the superstrate is gradually flattened and the entire superstrate is in contact with the formable material as illustrated in FIGS. 1C-1G. As the superstrate 108 is being lowered, and During step S203 a contacting step S204 is initiated at a contact time $t_C$, the processor 130 may causes an initial portion of the superstrate 108 to come into contact with the formable material 118 on the substrate 102.

During a spreading step S206, the formable material 118 then spreads out towards the edge of the substrate over a spreading period. How the formable material 118 spreads and fills the substrate surface 124 can be observed via the spread camera 126 and may be used to track a progress of a fluid front of formable material. The spreading step S206 starts at the contact time $t_C$ and continues during the contacting step S204.

In a curing step S208, the processor 130 may send instructions to the radiation source 120 to send a curing illumination pattern of actinic radiation along the exposure path through the shaping surface 110. The curing illumination pattern provides enough energy to cure (polymerize, solidify, etc.) the formable material 118 under the shaping surface 110. In an embodiment, the curing step S208 may start before the end of one or both of steps S204 and S206. The curing step S208 ends after the end of both steps S204 and S206. The curing step S208 may be considered to end when the formable material 118 no longer receives actinic radiation from the radiation source 120.

In a separation step S210, the processor 130 uses one or more of the substrate chuck 104, the substrate positioning stage 106, superstrate chuck 112, and the superstrate positioning head 114 to separate the shaping surface 110 from the cured formable material on the substrate 102. In an embodiment, the separation step S210 is performed after the curing step S208 has finished.

In an embodiment, after the shaping process 200 is finished additional semiconductor manufacturing processing is performed on the substrate 102 in a processing step S212 so as to create an article of manufacture (e.g. semiconductor device). In an embodiment, each substrate 102 includes a plurality of devices.

The further semiconductor manufacturing processing in processing step S212 may include etching processes to transfer a relief image into the substrate that corresponds to the pattern in the cured layer or an inverse of that pattern. The further processing in processing step S212 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

The shaping process 200 also includes a pressure reduction step S214. The pressure reduction step S214 is performed during the contacting step S204. The pressure reduction step S214 includes reducing a pressure in an environment beyond an edge of the substrate from a first pressure to a second pressure. The pressure reduction step S214 is performed while the superstrate (or template) 108 is contacting the formable material 118.

Superstrate Chuck

Figure 1B:
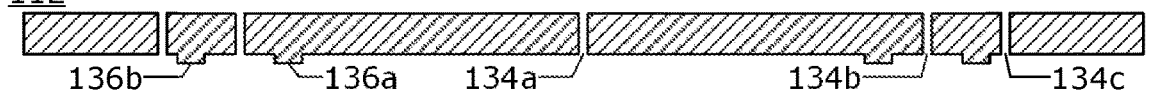
FIG. 1B is an illustration of an exemplary superstrate chuck.
Figure 1C:
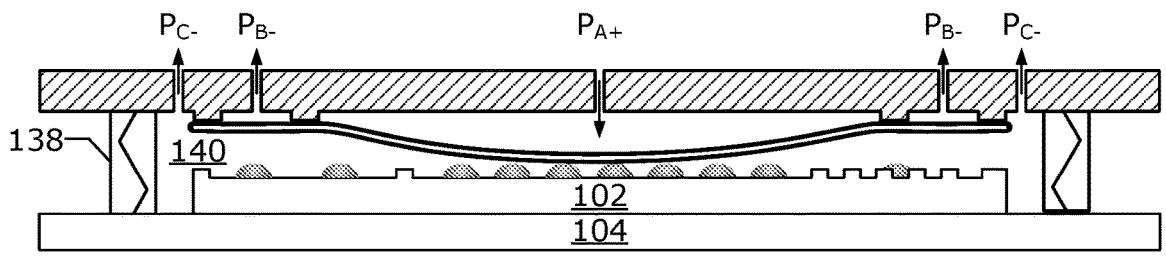
FIGS. 1C-G are illustrations of portions an exemplary adaptive planarization system during the shaping method.

FIG. 1B is an illustration of the superstrate chuck 112 as might be used in an embodiment. The superstrate chuck may be transparent to actinic radiation. The superstrate chuck 112 might have an opening that allows for actinic radiation to pass through it. The superstrate chuck 112 includes a plurality of ports 134 and a plurality of lands 136. The superstrate chuck 112 includes one or more central ports 134a which guide a fluid (for example clean dry air CDA or some other medium) in and out of a central region defined by interior lands 136a and the superstrate 108. The interior land 136a may be a single circular land 136a. In an alternative the superstrate chuck 112 includes a plurality of concentric interior circular lands 136a. The central ports 134a may apply a positive pressure $P_{A+}$ via the central port(s) 134a to deform the superstrate 108 as illustrated in FIG. 1C. In an alternative embodiment, the central port(s) 134a may be replaced or augmented by one or more components for supplying an electrostatic force, a magnetic force, and/or pins for deforming the superstrate 108.

The superstrate chuck 112 also includes one or more intermediary port(s) 134b between the interior land(s) 136a and exterior land(s) 136b. The superstrate chuck 112 may apply a negative pressure $P_{B-}$ via the intermediary port(s) 134b to hold the superstrate 108 before imprinting as illustrated in FIG. 1A and as the superstrate is being lowered and deformed as illustrated in FIG. 1C. In an alternative embodiment, the intermediary port(s) 134b may be replaced or augmented by one or more components for supplying an electrostatic force, a magnetic force, and/or a latching mechanical force for gripping the superstrate 108. The superstrate chuck 112 may also include a plurality of concentric lands between the interior land(s) 136a and exterior land(s) 136b and may also include a plurality of intermediary ports 134b for applying a set of apply a negative pressure $P_{B-}$ to different zones of the superstrate.

The superstrate chuck 112 may also include one or more exterior port(s) 134c between the exterior land(s) 136b and a compliant seal 138. The superstrate chuck 112 may apply a negative pressure $P_{C-}$ via the exterior port(s) 134c to reduce a pressure in a gap environment 140 beyond an edge of the substrate 102 from a first gap pressure $P_{G1}$ to a second gap pressure $P_{G2}$, while the superstrate (template) is contacting the formable material 118 during a contacting period. In an alternative embodiment, the exterior port(s) 134c are not in the superstrate chuck 112 and are instead in and/or adjacent to the substrate chuck 104. In an alternative embodiment, the exterior port(s) 134c are not in the superstrate chuck 112 and are instead in a component attached to one or more of: the superstrate chuck 112; the substrate chuck 104; or a body attached to one of the chucks.

The compliant seal 138 may be an elastic member between the superstrate chuck 112 and the substrate chuck 104. The compliant seal 138 allows for the gap environment 140 to be controlled during the pressure reduction step S214. In an embodiment, the compliant seal 138 is attached to the superstrate chuck 112 and only comes into contact with the substrate chuck 104 during a portion of the shaping process 200. In an embodiment, the compliant seal 138 is attached to the substrate chuck 112 and only comes into contact with the superstrate chuck during a portion of the shaping process 200. In an embodiment, the compliant seal 138 is attached one or more components that are also attached to one or both of the substrate chuck 104 and the superstrate chuck 112. In an embodiment, the compliant seal 138 includes multiple components on both sides of the gap environment 140 which mate so to seal the gap environment 140 away from the neighboring environment. In an embodiment, there is no compliant seal 138 instead there is a narrow gap between the superstrate chuck 112 or a component attached to the superstrate chuck 112 and the substrate chuck 104 or a component attached to the substrate chuck 104. In an embodiment, there may be a sealing fluid in the narrow gap. In an embodiment, the narrow gap may also include the exterior port 134c.

Inside of the superstrate chuck 112 there may be a plurality of channels in which fluid, gas, and/or vacuum is supplied to the ports 134. The superstrate may also include a plurality of connection ports which are connected to the channels. Each of these connection ports may then be connected to one or more pumps, valves, solenoids, gas sources, gas tubing, mass flow controllers, etc. The connection ports are located outside of the path of the actinic radiation such as on and/or towards the edge of the superstrate chuck 112.

Spreading Step

During the spreading step S206, the spread dynamics of the formable material 118 is influenced by a plurality of control parameters. Example of such a control parameter is the gap pressure $P_G$ of a gas in the gap environment 140 adjacent to the spreading formable material 118 on FIG. 3A. Another control parameter is the rate at which the superstrate (template) 108 is brought into contact with formable material 118 on the substrate 108. Another control parameter is the bending shape of the superstrate (template) during the contacting step S204. The bending shape is controlled by positive pressure $P_{A+}$. Another control parameter is a pressure differential $\Delta P$ between the front and back side of the superstrate (template). Another control parameter is a composition of the gas in in the gap environment 140 adjacent to the spreading formable material 140. Another control parameter is imprint force.

The applicants have determined that the spread dynamics can be altered by reducing the gap pressure $P_G$ in the in gap environment 140 during the spreading time. The applicants have determined that the this helps with dynamic control of the contact line propagation. The applicants have determined that it also increases velocity of the escaping gas.

In an embodiment, control of gas pressure in an environment (gap environment 140) beyond an edge of the substrate, and movement of the superstrate (template) are synchronized. In an embodiment, the formable material 118 may be dispensed onto the substrate surface 124 as a plurality of drops during step S202. During step S204 the shaping surface 110 comes into contact with the drops of formable material 118. These drops spread and merge due to the newly introduced pressure from the shaping surface 110 and newly introduced capillary pressure due to the narrowness of the gap (e.g. <1 μm) between the shaping surface 110 and the substrate surface 124.

Prior to the contacting step S204, pressure is applied to a central part of the superstrate 108 with a positive pressure $P_{A+}$ by the superstrate chuck 112 bending the shaping surface 110 as illustrated in FIG. 1B. In an embodiment, one or more perimeter zones of the superstrate chuck 112 apply a negative pressure $P_{B-}$ to the superstrate 108 to ensure that the superstrate 108 stays attached to the superstrate chuck 112. FIGS. 1D-G illustrate how the formable material spreads under the superstrate 102 as the gap between the superstrate chuck 112 and the substrate chuck 104 decreases and the positive pressure $P_{A+}$ is reduced. In an embodiment, pressure is applied to a central part of the superstrate 108 with a positive pressure $P_{A+}$ by the superstrate chuck 112 bending the shaping surface 110 as illustrated in FIG. 1B prior to step S203. In an alternative embodiment, pressure is applied to a central part of the superstrate 108 with a positive pressure $P_{A+}$ by the superstrate chuck 112 bending the shaping surface 110 as illustrated in FIG. 1B after step S203 starts.

The applicants have found that uniformity of the film formed by the shaping process 200 suffers if the contact line propagates faster than escaping gas between the shaping surface 110 and the substrate surface 124. One defect relates to this issue is the creation of unwanted voids.

Superstrate Bending

Figure 1D:
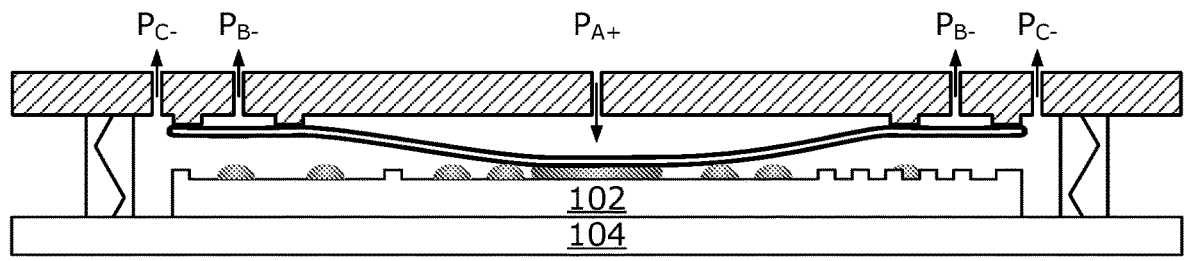
Figure 1E:
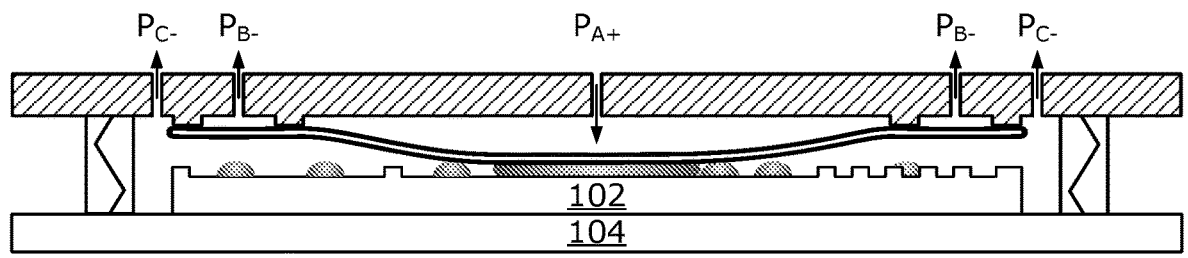
Figure 1F:
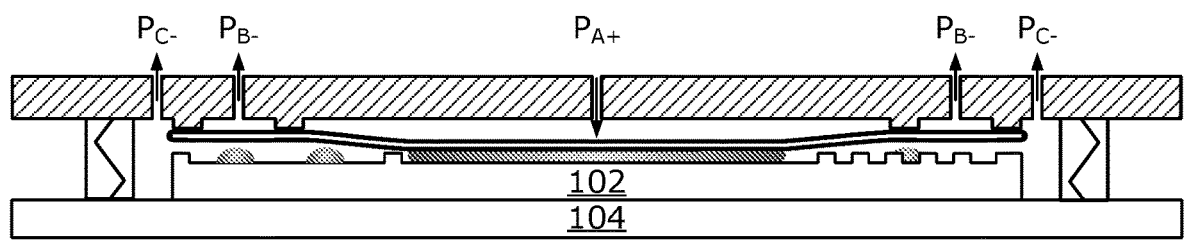
Figure 1G:
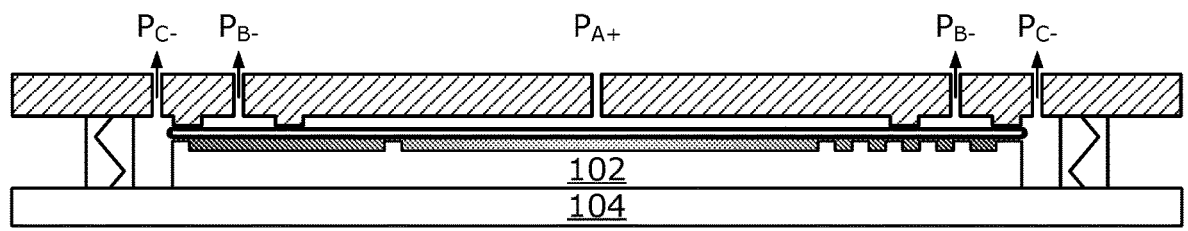
Figure 3A:
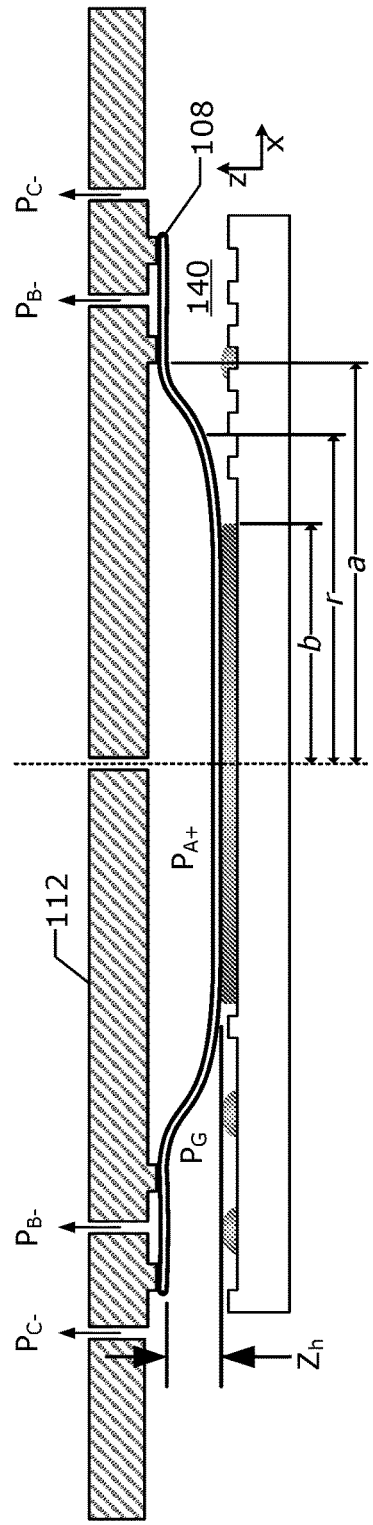
FIG. 3A is an illustration a portion of an exemplary adaptive planarization system showing dimensions of the system during the shaping method.

FIG. 3A is an illustration of the superstrate 108 as it is being bent by the superstrate chuck 110 during the contacting step S204. The superstrate 108 is attached to the superstrate chuck 110 by the use of a vacuum zone due to negative pressure $P_{B-}$. Before the superstrate 108 comes into contact with the formable material 118 the superstrate 108 is curved by the positive pressure $P_{A+}$. Once the shaping surface 110 comes into contact with the formable material a central portion of the superstrate 108 flattens out as illustrated in FIGS. 1D-F. For a radially symmetric superstrate that contacts the formable material in the radially symmetric manner the flat portion will also have a contact radius b as illustrated in FIG. 3A. This contact radius b is defined by the position of contact line. During the contacting step S204, the contact radius b will start at zero and increase until all the formable material has finished spreading. Starting at a holding radius a is the point where the superstrate is maintained at a flat state by the negative pressure $P_{B-}$ of the superstrate chuck. The positive pressure $P_{A+}$ pressure applied to the back side of the superstrate is greater than the gap pressure $P_G$ by a pressure difference $\Delta P$, equation (1), causing the superstrate to bend in the radius range from b to a.

$$\Delta P = P_{A+} - P_G \qquad (1)$$

In order to understand the spread dynamics of the formable material it is useful to estimate the bent portion of the superstrate over a shifted range originating at the contact radius b. over a range $0<r'<(a-b)$ in which $r'=r-b$. Equation (2) is an estimation of the moment of inertia I of a superstrate 108 with a superstrate thickness $S_T$.

$$I = \frac{S_T^3}{12} \qquad (2)$$

The applicants have found it useful to approximate the bending of the superstrate with a function Z(r') based on the analytical solution for beam bending as shown by equation (3) below. The slope (m) of the superstrate may be approximated by equation (4) below. While the second derivate is shown in equation (5) below. Where E is Young's modulus which for fused quartz is 72 GPa.

$$Z(r') = -\frac{\Delta P_T}{72EI}(3r'^4 - 4(a-b)r'^3 + (a-b)^4) \qquad (3)$$

$$m(r') = \frac{\partial Z}{\partial r'} = -\frac{\Delta P_T}{6EI}r'^2(r' - (a-b)) \qquad (4)$$

$$\alpha(r') = \tan^{-1}(m(r'))$$

$$\frac{1}{\rho(r')} = \frac{\partial^2 Z}{\partial r'^2} = -\frac{\Delta P_T}{6EI}r'(3r' - 2(a-b)) \qquad (5)$$

Figure 3B:
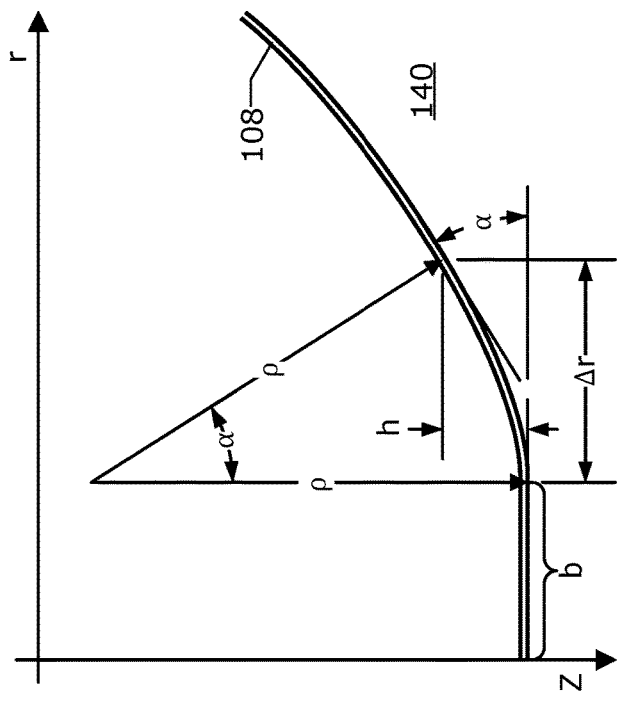
FIG. 3B is an illustration a portion of superstrate that is bent during the shaping method.
Figure 3C:
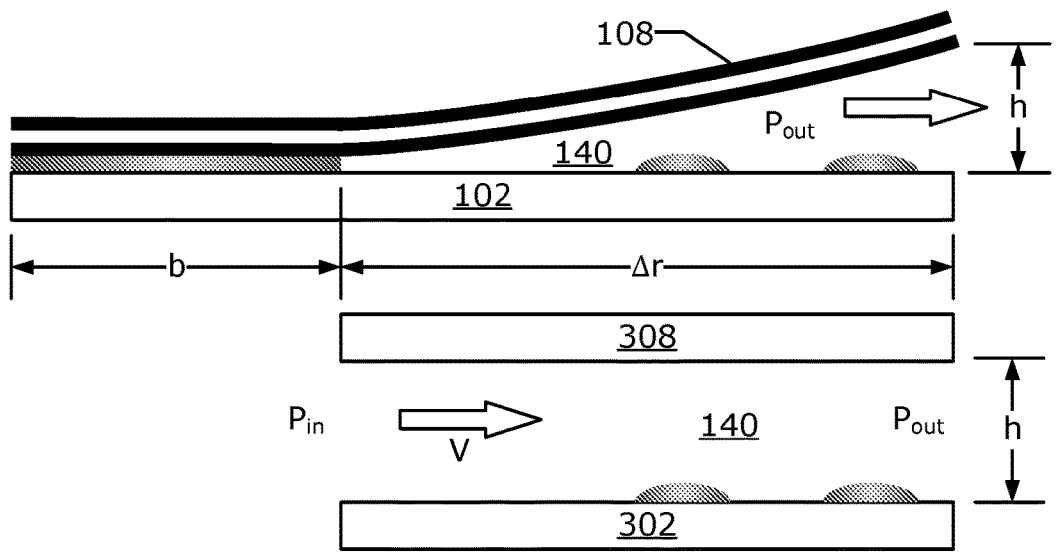
FIG. 3C is an illustration showing how gas is pushed out from underneath the superstrate during the shaping process and a flat plate approximation.

As described by equation (4) the slope (m) is zero at the contact radius (b) and at the holding radius (a). FIG. 3B is a simplified illustration of the region of the superstrate 108 adjacent to the contact radius (b). FIG. 3B shows the bending radius $\rho(\Delta r)$, the bending angle $\alpha(\Delta r)$, and a gap height h between the shaping surface 110 and the substrate surface 124. Equation (6) is an estimate of the linear decrease in gap height h, relative to the contact radius.

$$h = Z(0) - Z(\Delta r) = \frac{\Delta P_T \Delta r^3}{72EI}(4a - 3\Delta r - 4b) \qquad (6)$$

Figure 3D:
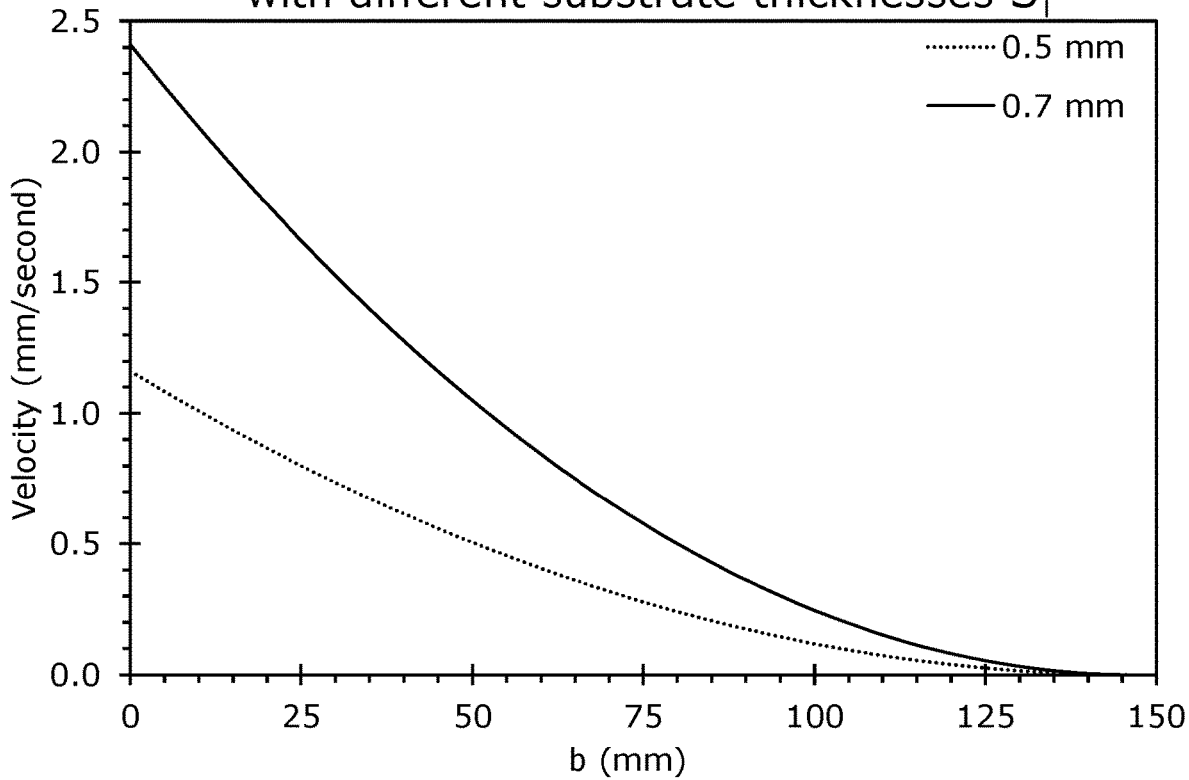
FIG. 3D is a graph showing an estimated relationship between the gas velocity and the contact radius underneath the superstrate during the shaping process for different superstrate thicknesses.

In order to understand the flow of gas out from under the superstrate 108, the applicants have found it useful to estimate the gas velocity near the contact radius (b) by approximating the curved gap between substrate surface 124 and the bent shaping surface 110 as two parallel plates 308 and 302 as illustrated in FIG. 3D with a gap height h. This is a reasonable approximation because, the curvature at an offset of $\Delta r$ is less than an arcminute as estimated by equation (4).

The gas velocity V of gas being pushed out between the two plates 302 and 308 illustrated in FIG. 3D can be estimated based on Navier-Stokes equation resulting in equation (7) below, in which $\xi$ is the gas viscosity. At 20° C. the gas viscosity for helium is $1.96*10^{-5}$ Pa·s while for air it is $1.82*10^{-5}$ Pa·s.

$$V = -\frac{h^2}{3\xi}\frac{(P_{in} - P_{out})}{\Delta r} \qquad (7)$$

The applicants have found that when $\Delta r$ is about 2 mm, the pressure of the gas leaving the gap, $P_{out}$ is approximately equal to the gap pressure $P_G$ which can be controlled by negative pressure $P_{C-}$. The applicants have also found that in a state of dynamic equilibrium, the initial pressure $P_{in}$ in the gap is a function of at least the back pressure $P_{A+}$ applied to the superstrate 108, and the contact line speed (db/dt) among other shaping conditions. Under some situations when the contact radius propagates very slow, while still being stable, the initial pressure $P_{in}$ is approximately equal to the back pressure $P_{out}$. The initial pressure $P_{in}$ is also influenced by a force that superstrate applies to formable material 118; contact line velocity; superstrate stiffness; formable material thickness, properties of the gas in the gap environment 140. The gas in the gap environment 140 may be helium, clean dry air (CDA), argon, neon, hydrogen, xenon, krypton, or any mixture of those. When the contact line velocity is much less than velocity of the gas escaping the gap environment 140, the differential pressure $(P_{in}-P_{out})$ drops to close to zero.

Figure 3E:
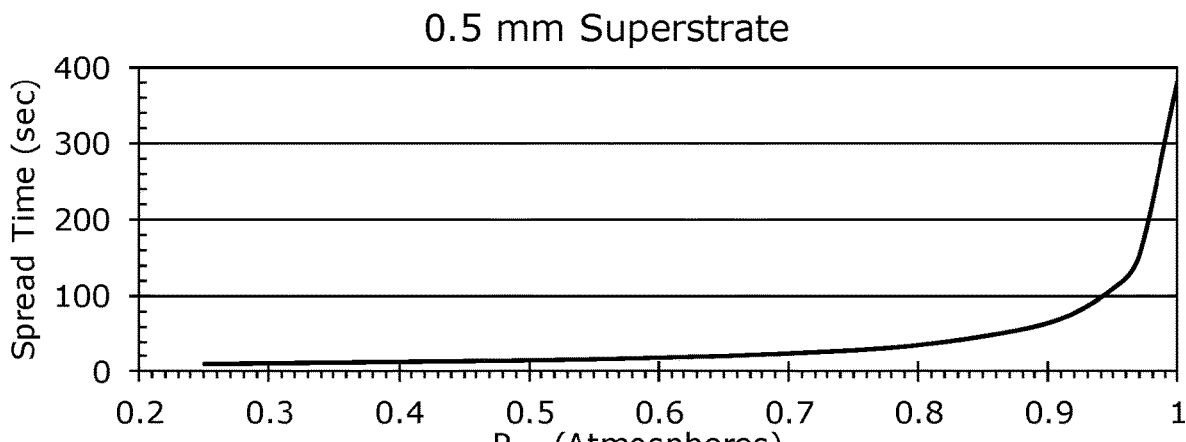
FIGS. 3E-G are graphs showing an estimated relationship between the spread time and the contact radius underneath the superstrate during the shaping process for different superstrate thicknesses.

FIG. 3E is an estimation of the gas velocity V in which the gas is helium, $P_{out}$ is 101 kPa and $P_{in}$ is 102.9 kPa and the gap h is estimated using equation (6) for a fused quartz superstrate 108 with a 350 mm diameter; a 0.5 and 0.7 mm superstrate thickness $S_T$; at a 2 mm offset ($\Delta r$); and a holding radius of 150 mm. A constant 2 kPa pressure differential ($\Delta P_T$) was used for the 0.5 mm superstrate and a 5 kPa pressure differential ($\Delta P_T$) was used for the 0.7 mm superstrate. As illustrated in FIG. 3E, there is a tendency for the gas velocity V to be reduced as the contact radius b moves towards the holding radius a. Equation (7) illustrates how the gas velocity V can be increased by adjusting the gap pressure $P_G$, when the rest of the system is held constant.

In an embodiment, superstrate back pressure $P_{A+}$ is adjusted based on the superstrate thickness $S_T$ in order to maintain a similar template curvature during the formable material spreading phase. There is an upper limit for the superstrate back pressure $P_{A+}$ based on the ability of superstrate to withstand pressure without damage which is function of the superstrate thickness $S_T$ and the superstrate material.

These estimations are an oversimplification in order to highlight the overall trends in the system. We assume that all the expelled gas has time to dissipate into the surrounding environment while template contact line moves from a point at $b=b_1$ to a point at $b=b_2$. If the contact line is moving fast enough there can be significant gas compression in the gap environment 140 leading to buildup in $P_{in}$. The applicants have found that when $P_{in}>P_{A+}$ the propagation front becomes unstable.

This method allows us to estimate the total spread time while still being in the stable fluid spreading regime. The applicants have found that the maximum speed of the contact line should be equal to or below the velocity of the escaping gas. The applicants have estimated that the shortest spread times in with a stable fluid front for a for 0.5 mm superstrate would be over 6 minutes while for a 0.7 mm superstrate it would be over 3 minutes. In order to improve throughput a method is needed to improve throughput by reducing spread times.

Pressure Reduction Step

The applicants believe that in order to facilitate faster spreading a pressure in an environment beyond an edge of the substrate should be reduced from a first pressure to a second pressure, while the superstrate is contacting the formable material. The gas an area near the superstrate and the substrate can be partially evacuated to reduce its pressure by for example applying a negative pressure $P_{C-}$ to a vacuum port that is in fluid communication with a gap environment 140 between the superstrate and the substrate.

Figure 3F:
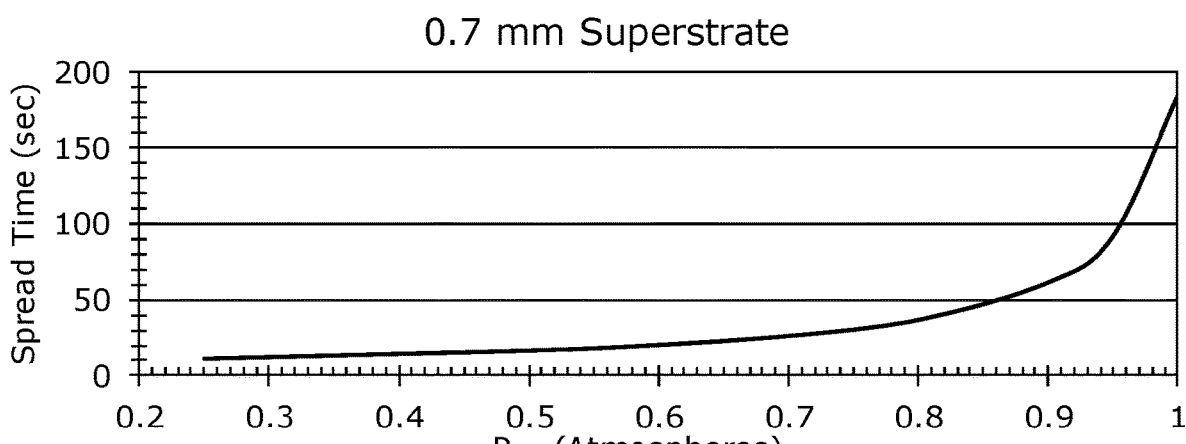
Figure 3G:
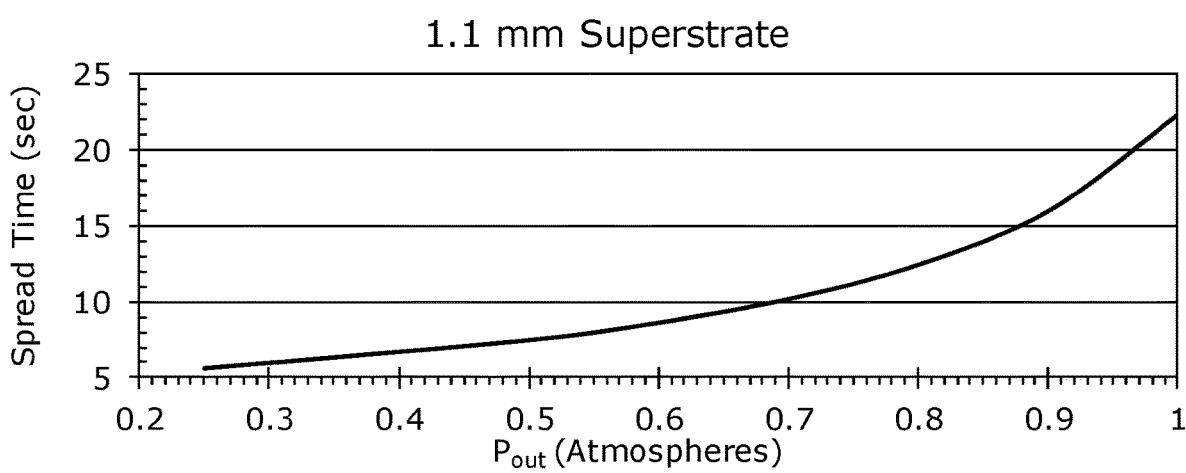

FIGS. 3E-G are estimations of how the spread time may be reduced by also reducing the pressure in the gap environment 140 for superstrate thicknesses $S_T$ of: 0.5 mm; 0.7 mm; and 1.1 mm. In which the spread time is defined as the amount of time required for the contact radius b starting from zero to reach the holding radius a. Reducing the pressure in the gap environment 140 increases the gas velocity V in accordance with equation (7) when the latter escapes from the gap environment 140 between shaping surface 110 and substrate surface 124. The applicants have found that reducing the pressure in the gap environment 140 leads to better control of the propagation of the contact line b while also speeding up the propagation of the contact line b. The applicants have also found that increasing the gas velocity V allows for an increase in the pressing speed ($\partial Z/\partial t$) of the imprint head 114 without causing non-fill defects. Solving equation (3) at the endpoints (r'=0 and r'=a−b) shows how for a given $\Delta P_T$ the position of the contact line is a function of the imprint head position $Z_h$. As illustrated in FIG. 3A the imprint head position $Z_h$ is determined by the difference between the minimum and maximum positions of the shaping surface at any one time.

$$Z(0) = -\frac{\Delta P_T}{72EI}(a-b)^4 = -Z_h \quad (8)$$

$$Z(a-b) = 0$$

$$b = a - \left(\frac{72EI}{\Delta P_T}Z_h\right)^{1/4}$$

$$\Delta P_T = P_{A+} - P_G$$

In the context of equation (8) the pressure differential $\Delta P_T$ is the pressure difference between pressure on the back side of the superstrate $P_{A+}$ and the gap pressure $P_G$. As the gap pressure is reduced the pressure differential $\Delta P_T$ is increased. The propagation of the contact radius b is controlled by: the imprint head position $Z_h$; the positive pressure $P_{A+}$; and the gap pressure $P_G$. as described by equation (9) below.

$$\frac{db}{dt} = \frac{\partial b}{\partial P_{A+}}\frac{\partial P_{A+}}{\partial t} + \frac{\partial b}{\partial P_G}\frac{\partial P_G}{\partial t} + \frac{\partial b}{\partial Z_h}\frac{\partial Z_h}{\partial t} \quad (9)$$

$$\frac{db}{dt} = \frac{1}{4}\left(\frac{72EI}{\Delta P_T}Z_h\right)^{1/4}\left(\frac{1}{\Delta P_T}\left(\frac{\partial P_{A+}}{\partial t} - \frac{\partial P_G}{\partial t}\right) - \frac{1}{\sqrt{Z_h}}\frac{\partial Z_h}{\partial t}\right)$$

Figure 4A:
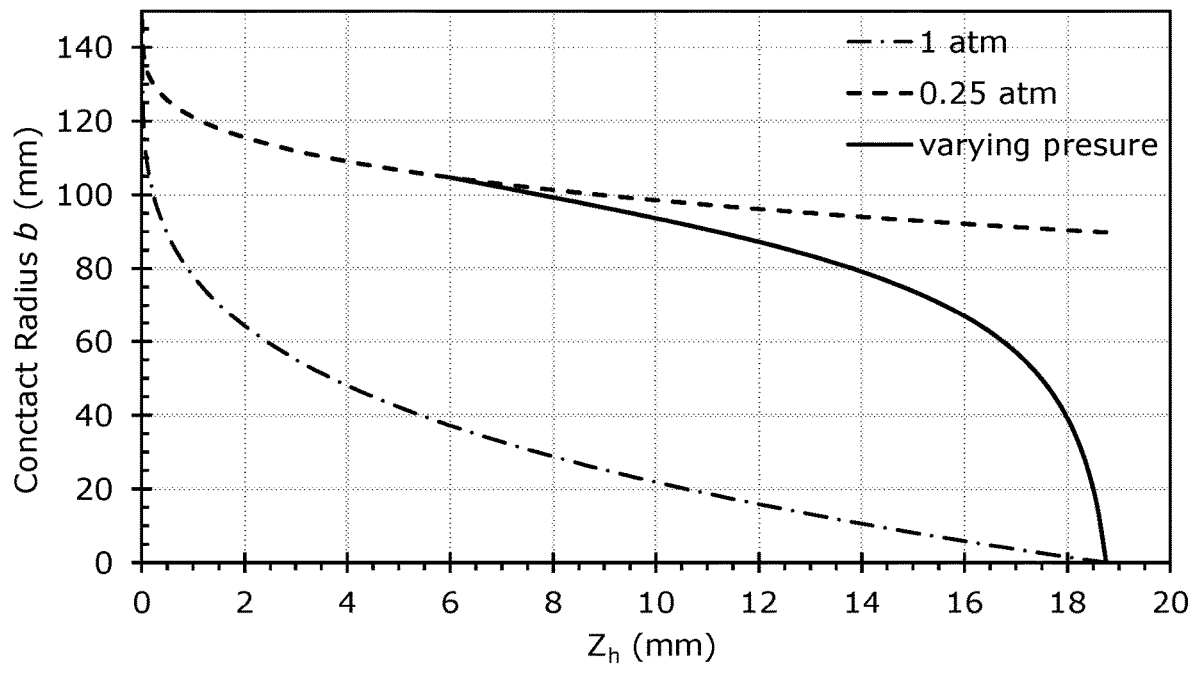
FIGS. 4A-D are graphs showing an estimated relationship between gap height and the contact radius underneath the superstrate during the shaping process for different superstrate thicknesses.
Figure 4B:
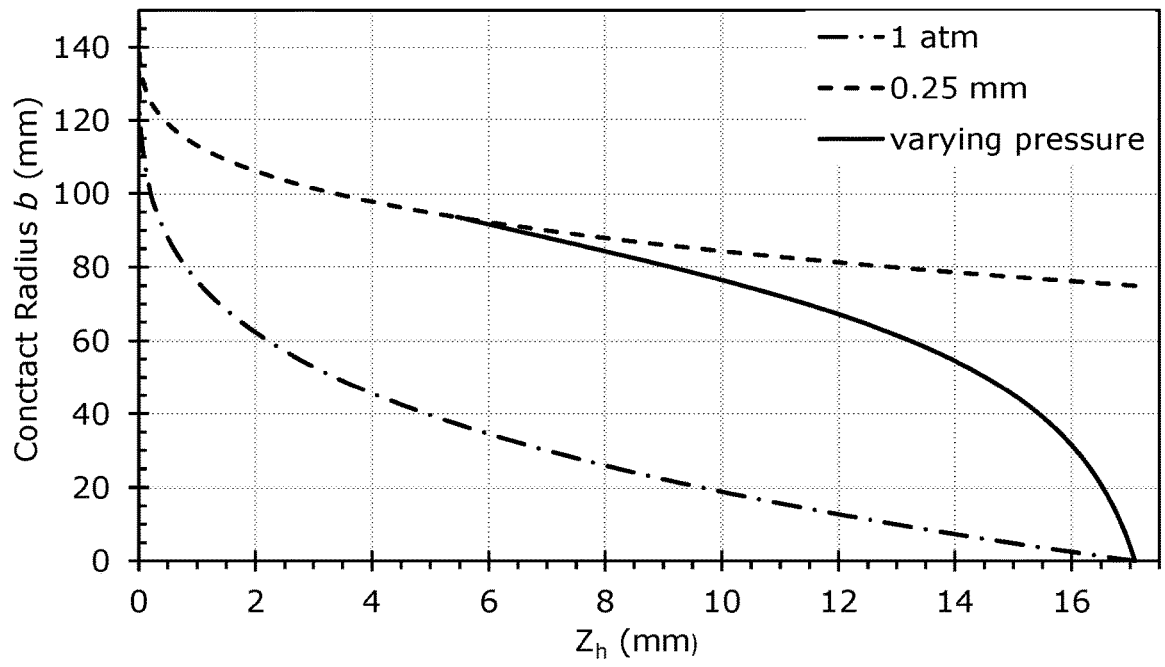
Figure 4C:
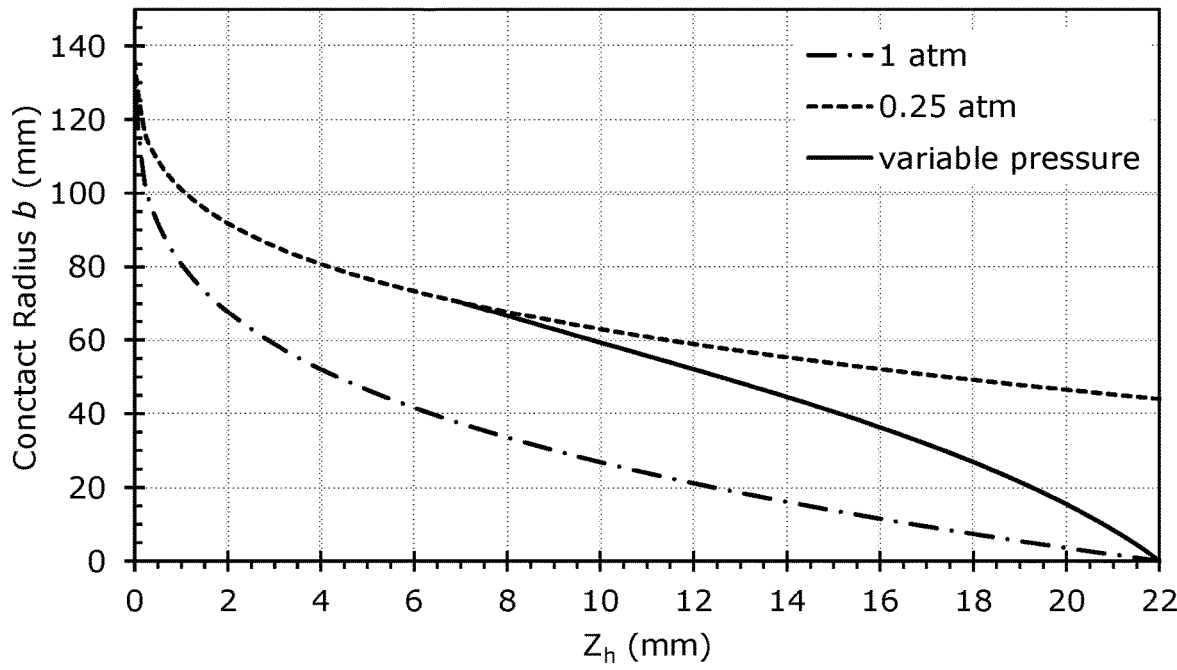

FIG. 4A illustrates how the contact radius b as a function of imprint head position $Z_h$ for a 0.5 mm superstrate thickness $S_T$ as a function of gap pressure $P_G$. Three examples are illustrated in which the gap pressure $P_G$ is a static 1 atmosphere; a static 0.25 atmospheres; and in which it varies from 1 atmosphere down to 0.25 atmosphere all of which is happening while the imprint head position $Z_h$ is reduced down to zero. FIG. 4B illustrates the same system illustrated in FIG. 4A but with a 0.7 mm superstrate thickness $S_T$. FIG. 4C illustrates the same system illustrated in FIG. 4A but with a 1.1 mm superstrate thickness $S_T$.

The applicants have determined that a reduction in the gap pressure $P_G$ makes the spread front b propagation more sensitive to the imprint head position $Z_h$. The applicants have found when the initial contact occurs; and the gap pressure $P_G$ is low; the contact radius b will propagate in an uncontrolled manner. For example, if the superstrate thickness $S_T$ is 0.5 mm the gap pressure $P_G$ is reduced down to 0.25 atmospheres the contact radius b starts at 90 mm instead of zero.

Figure 4D:
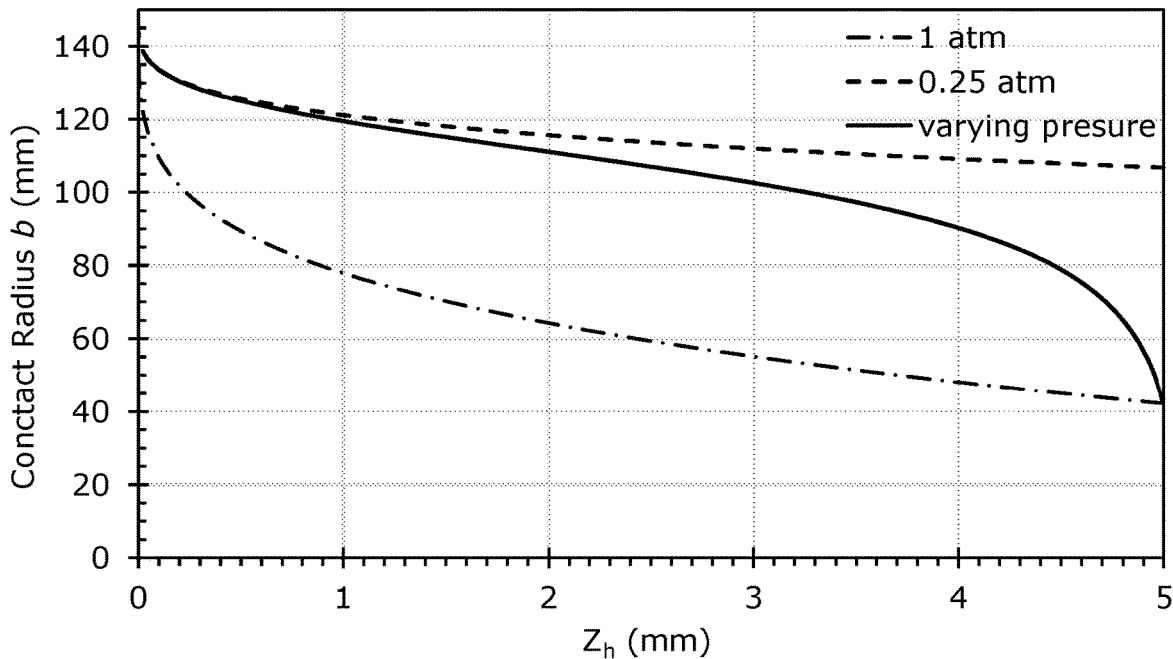

In an embodiment, the superstrate 108 may be used repeatedly. In a case in which the superstrate is used repeatedly, the applicants have found that there is limit to the bowing of the superstrate 108 before it causes changes the performance of the superstrate 108. A limit on the allowed amount of bowing will also place a limit on the imprint head position $Z_h$ at the initial contact time $t_C$ which also puts a limits on the contact radius b at the initial contact time $t_C$. The limit on the imprint head position $Z_h$ depends on material properties of the superstrate; thickness of the superstrate; and desired performance characteristics of the superstrate. The limit on the imprint head position $Z_h$ may be: 25 mm; 5 mm; 3 mm; 1 mm 0.1 mm; etc. FIG. 4D illustrates the same system illustrated in FIG. 4A but imprint head height $Z_h$ is limited to 5 mm and the gap pressure $P_G$ changes linearly from approximately 1 atmosphere to 0.25 atmospheres.

In order to provide for better control of the propagation contact radius b, the gap pressure $P_G$ is dropped in step S214 at the same time as the superstrate chuck moves down in step S203. For example, as illustrated in FIG. 4A if a variable pressure is used it takes 1.8 mm of vertical displacement to move the contact radius b from zero to 60 mm. For a comparison, at 1 atmosphere of pressure is used it takes 16 mm of vertical displacement for the contact radius to move from zero to 60 mm. The applicants have found that this reduction of outside pressure while moving the superstrate down improves the performance of contact radius propagation.

In an embodiment, two or more of: the rate of change of the gap pressure ($\partial P_G/\partial t$); the rate of change of the back pressure ($\partial P_{A+}/\partial t$); and rate of change of the imprint head position ($\partial Z_h/\partial t$) are controlled such that the rate of change of the contact radius (db/dt) is constant for a portion of the contact period. This allows the contact radius b to propagate in a linear manner as the vertical distance ($Z_h$) between superstrate and substrate is reduced, for example with a fixed vertical speed over at least a portion of the contact radius propagation. The applicants have found that this helps ensure better dynamic control of the contact line propagation. This can also help make the front line propagate faster in the initial phase of spreading.

A big advantage of the invention is a reduction in the gap pressure $P_G$ increases the velocity (V) of gas trapped between the shaping surface 110 and the substrate surface 124. This in turn allows faster propagation of the contact line without a danger to causing mechanical instability that can lead to trapped gas, resist thickness variations, and other imprint defects. Faster contact line propagation correspondingly reduces the total spread time.

As illustrated by equation (9) above, the contact line propagation can also be controlled by controlling the positive pressure $P_{A+}$ that is applied to the back of the superstrate.

Contacting Step

During the contacting step S204, the applicants have found it useful to initially contact only a limited portion of the formable material 118 with the shaping surface 110 at an initial contact time $t_C$ as illustrated in FIG. 1D. Please note that FIGS. 1C-3G are not to scale. The values described in this paragraph are typical values and describe the current state of the art and should not be considered limiting and are merely used to describe the scale of the elements in a preferred embodiment. The typical topography on the substrate is between 1 nm and 500 nm in height. The typical width of the recesses and protrusions on the substrate are between 10 nm and 2 mm. The typical droplets of formable material may be between 0.6-10 picolitres. The typical average diameter of the droplets may be between 1 μm and 100 μm. The typical diameter of a substrate is between 100-450 mm. The typical droplets of formable material may have a height after the initial contact time $t_C$ of less than 1 μm.

The shaping system 100a initially contacts only a portion of the formable material, at the initial contact time $t_C$, by adjusting one or more of: the positive pressure $P_{A+}$ as illustrated in FIG. 5A; the initial gap pressure $P_{G0}$ as illustrated in FIG. 5D; and an initial imprint head position $Z_{h0}$ as illustrated in FIG. 5E. The initial gap pressure $P_{G0}$ is controlled by controlling one or more of: an initial positive pressure $P_{A0+}$; an initial negative pressure $P_{C-}$; and the imprint head position $Z_h$. The initial imprint head position $Z_{h0}$ is determined by the difference between the minimum and maximum positions of the shaping system 100a when the superstrate 108 first contacts the formable material 118. Prior to the initial contact time $t_C$, the initial positive pressure $P_{A0+}$ is applied to the superstrate 108 by the superstrate chuck 112 so as to bow out the superstrate 108 as illustrate in FIGS. 5A-5G.

As illustrated in FIG. 5A, the positive pressure $P_{A+}$ is applied to the superstrate 108 by the superstrate chuck 112 prior to the initial contact time $t_C$ so that the superstrate is bowed at the initial contact time $t_C$. Prior to the exposure time $t_E$ the superstrate is unbowed by an unbowed time $t_U$. The superstrate is unbowed by reducing the positive pressure $P_{A+}$ down to zero by the unbowed time $t_U$. In between the initial contact time $t_C$ and the unbowed time $t_U$, the positive pressure $P_{A+}$ may vary such that the amount of bowing is controlled so as to control the contact radius b. In an embodiment, the positive pressure $P_{A+}$ is supplied as air pressure from the superstrate chuck 112. In an alternative embodiment, the positive pressure $P_{A+}$ is supplied by an electrostatic repulsive force. In an alternative embodiment, the positive pressure $P_{A+}$ is supplied by one or more pins.

While the superstrate 108 is being bowed, a negative pressure $P_{B-}$ is applied to another portion of the superstrate 108 by the superstrate chuck 112 so as to ensure that the superstrate 108 is retained by the superstrate chuck 112. In an embodiment, the negative pressure $P_{B-}$ is constant or at least always sufficient to ensure that the superstrate is retained by the superstrate chuck while the shaping process (200) is performed over a plurality of different superstrates as illustrated in FIG. 5B. In an alternative embodiment, the negative pressure $P_{B-}$ is reduced after the unbowed time $t_U$ and prior to the exposure time $t_E$ such that the superstrate 108 is de-chucked from the superstrate at some point in time after both positive pressure $P_{A+}$ and the imprint head position $Z_h$ are minimized or reduced to zero as illustrated in FIG. 5B. This may be accomplished by reducing the retaining force, for example by reducing the negative pressure $P_{B-}$ down to zero as illustrated by the dotted line in FIG. 5B. The formable material 118 under the superstrate 108 is then cured forming a film layer on the substrate 102 during the curing step S208 at the exposure time $t_E$. In an alternative embodiment, during the separation step S210, the superstrate is again retained by one of the superstrate chuck 112 or a separate separation chuck (not shown). In an alternative embodiment, again retaining the superstrate 108 may be performed by increasing the negative pressure $P_{B-}$ as illustrated by the dotted line in FIG. 5B. In an embodiment, the negative pressure $P_{B-}$ is supplied by vacuum from a portion of the superstrate chuck 112. In an alternative embodiment, the negative pressure $P_{B-}$ is supplied by an electrostatic attractive force from the superstrate chuck 112 to a portion of superstrate.

In an embodiment, the superstrate 108 is then separated from the film layer on the substrate 102 during the separation step S210. In an embodiment, the superstrate chuck 112 is used during the separation step S210. In an alternative embodiment, a separation chuck (not shown) independent of the superstrate chuck 112 is used during the separation step S210.

During the contacting step S204, the processor 130 sends instructions to a pressure controller to reduce the gap pressure $P_G$ from an initial gap pressure $P_{G0}$ to first gap pressure $P_{G1}$, and then to a second gap pressure $P_{G2}$ (as illustrated in FIG. 5D) while the imprint head position is being reduced (as illustrated in FIG. 5E).

In an embodiment, the shaping system includes compliant seal(s) 138, which help to create a sealed or semi-sealed gap environment surrounding the substrate. Gap environment 140 is open until the imprint head position $Z_h$ reaches a first critical position $Z_{h1}$, this may occur at a sealing time $t_S$ prior to or after the initial contact time $t_C$. At the sealing time $t_S$ the compliant member is in a position so as to provide a sealed or semi-sealed environment as illustrated in FIG. 1C. As illustrated in FIG. 5C the amount of negative pressure $P_{C-}$ supplied by the exterior port 134c to the gap environment 140 increases a linear or non-linear manner until a second gap pressure is reached. In an embodiment, the amount of negative pressure $P_{C-}$ supplied by the exterior port 134c to the gap environment 140 prior to the sealing time $t_S$ is zero. In an alternative embodiment, some negative pressure is supplied by the exterior port 134c but is not very effective until the sealing time $t_S$. In an embodiment, the amount of negative pressure supplied by the exterior port(s) 134c increases (becomes more negative) in between the sealing time $t_S$ and the unbowed time $t_U$. At some point after the unbowed time $t_U$ the amount of negative pressure $P_{C-}$ supplied by the exterior port 134c may return to a nominal value (for example zero) before or after the exposure time $t_E$. In an embodiment, the trajectory of the gap pressure $P_G$ in the gap environment 140 follows the same pattern as the negative pressure $P_{C-}$ supplied by the exterior port 134c as illustrated by FIG. 5D and FIG. 5E. In an alternative embodiment, the negative pressure $P_{C-}$ is substantially constant and the trajectory of the gap pressure is controlled by the compliant seal 138. In an alternative embodiment, the trajectory of the negative pressure $P_{C-}$ and the performance of the compliant seal 138 work together to control the trajectory of the gap pressure $P_G$.

FIG. 5E is a timing charting illustrating how the imprint head 114 moves, varying the imprint head position $Z_h$, during a portion of the shaping process. The processor 130 may send instructions to one or more actuators to cause the superstrate chuck and the substrate chuck to approach each other. When the first critical position $Z_{h1}$ is reached at the sealing time $t_S$, the gap environment 140 starts to become sealed or partially sealed. After the imprint head 114 reaches the first critical position, the negative pressure $P_{C-}$ may start to be made more negative by increasing the vacuum pressure as discussed above. In an alternative embodiment, the vacuum pressure supplied to the exterior ports 134c is constant before and after the imprint head 114 reaches the first critical position $Z_{h1}$ but is ineffective until the gap environment is at least partially sealed as discussed above. In an embodiment, after the initial contact time $t_C$, the processor 130 sends instructions to a pressure controller to reduce the gap pressure $P_G$ from an initial first gap pressure $P_{G0}$ to a second gap pressure $P_{G2}$ while the imprint head position is being reduced. In an embodiment, after the initial contact time $t_C$ and after the imprint head 114 has reached first critical position $Z_{h1}$, the processor 130 sends instructions to a pressure controller to reduce the gap pressure $P_G$ from an initial first gap pressure to a second gap pressure $P_{G2}$ while the imprint head position $Z_h$ varies during a portion of the shaping process. The pressure controller may adjust the gap pressure $P_G$ by adjusting the trajectory of the negative pressure $P_{C-}$. In an embodiment, the sealing time $t_S$ occurs prior to the initial contact time $t_C$ or soon afterwards (less than 100 milliseconds).

In an embodiment, the processor 130 sends instructions to one or more actuators such that the imprint head position is reduced from a contact position $Z_{hc}$ at the initial contact time $t_C$ down to zero at the unbowed time $t_U$. The trajectory of the imprint head position $Z_h$ between the initial contact time $t_C$ and unbowed time $t_U$ may be linear or non-linear. When the imprint head position $Z_h$ is zero the superstrate 108 is unbowed by the positive pressure $P_{A+}$ and the superstrate 108 is held against the formable material 118 on the substrate 102. In an embodiment, the imprint head position $Z_h$ is held at zero until after the exposure time $t_E$ after which the imprint head is raised separating the superstrate 108 from the cured formable material. The imprint head position $Z_h$ as defined above as the difference between the minimum and maximum positions of the shaping surface at any one time so imprint head position may vary during separation. In an embodiment, the trajectory of the superstrate chuck 112 after the exposure time $t_E$ may be linear or non-linear. In an alternative embodiment, prior to the exposure time $t_E$ the superstrate 108 is released from the superstrate chuck 104 and the processor 130 sends instructions to one or more actuators to raise the superstrate chuck away from the superstrate.

FIG. 5F is a timing chart illustrating how the gas velocity V varies between the initial contact time $t_C$ and the unbowed time $t_U$. The trajectory of the gas velocity V may be linear or non-linear. As discussed above the applicants have found that increasing the amount of negative pressure $P_{C-}$ when all else is held constant increases the gas velocity V. The gas velocity V has an impact on non-fill defects. The applicants have found that increasing the gas velocity V reduces the non-fill defects.

FIG. 5F is a timing chart illustrating how the contact radius b varies between the initial contact time $t_C$ and the unbowed time $t_U$. The trajectory of the contact radius b may be linear or non-linear. The applicants have found that the relationship between contact line speed (db/dt) and the gas velocity V is important for minimizing and/or eliminating non-fill defects. In particular, the applicants have found maintaining the gas velocity V above the contact line speed (db/dt) reduces or eliminates non-fill defects.

Additional Embodiments

Figure 6A:
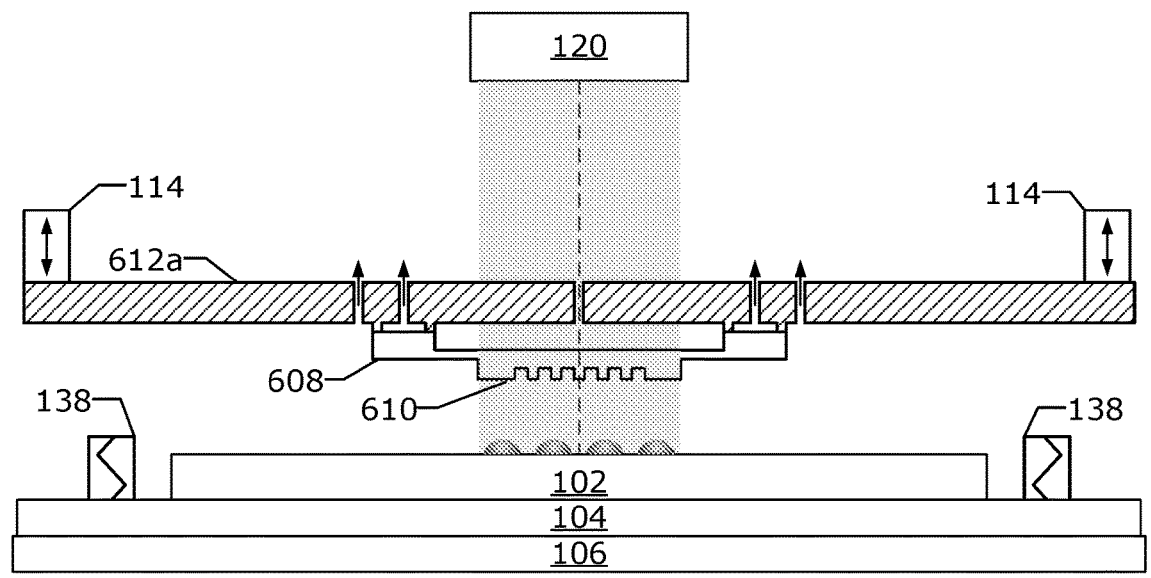
FIG. 6A is an illustration of an exemplary nanoimprint system having a template spaced apart from a substrate as used in an embodiment.

FIG. 6A is an illustration of an imprint lithography system 600a which may be used in an embodiment that is substantially similar to the shaping system 100a illustrated in FIG. 1A. The imprint lithography system 600a uses a template chuck 612a that is configured to hold a template 608. The template chuck 612a is substantially similar to the superstrate chuck 112 except that it is configured to the size and shape of the template 608. The template 608 may include a mesa that has a patterning surface 610. The mesa may extend above a recessed surface. An area of the patterning surface 610 may be less than an area of the substrate 102. The template 608 may be formed from materials including, but not limited to, fused-silica, quartz, silicon, organic polymers, siloxane polymers, borosilicate glass, fluorocarbon polymers, metal, hardened sapphire, and/or the like. The patterning surface 610 may have features defined by a plurality of spaced-apart template recesses and/or template protrusions. The patterning surface 610 defines a pattern that forms the basis of a pattern to be formed on the substrate 102. The process steps described above are identical for the imprint lithography system 600a and the shaping system 100a. The process steps may be performed in a step and repeat manner across the substrate. The imprint lithography system 600a may be a system for shaping films and may be used for shaping films on the substrate. The film that is shaped by the imprint lithography system 600a is an inverse of the patterning surface 610 with protrusions which match the recesses of the template 608 and recesses that the match the protrusions of the template 608.

Figure 6B:
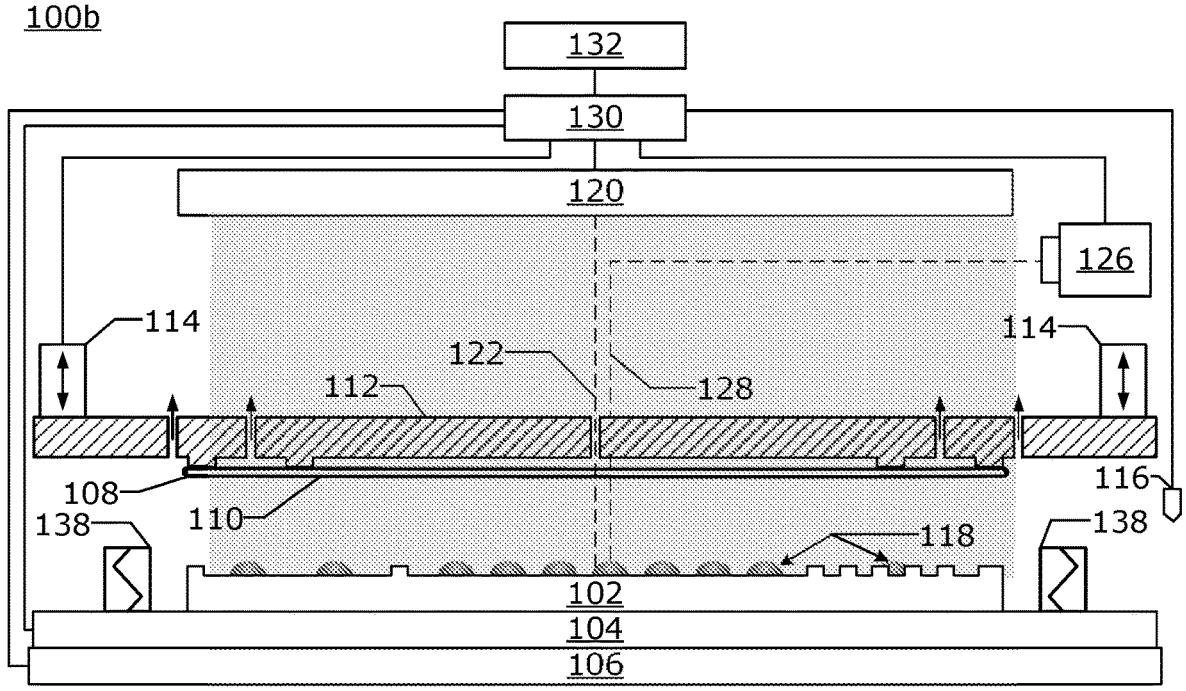
FIG. 6B is an illustration of an exemplary adaptive planarization system having a superstrate spaced apart from a substrate as used in an alternative embodiment.

FIG. 6B is an illustration of an alternative shaping system 100b in which the compliant seal 138 is attached to the substrate chuck 104 or 104 a body that is also attached to the substrate chuck 104.

Figure 6C:
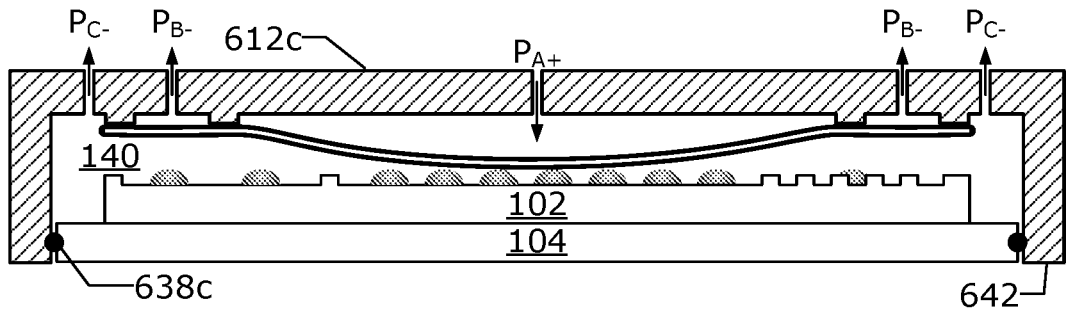
FIGS. 6C-E are illustrations of portions of an exemplary adaptive planarization system having a superstrate spaced apart from a substrate as used in alternative embodiments.

FIG. 6C is an illustration of a portion of an alternative shaping system in which the compliant seal 638c is between a side of the substrate chuck 104 and a sidewall 642. The sidewall 642 may be attached to or integral with the superstrate chuck 612c. As actuators move the superstrate chuck 612c relative to the substrate chuck 104 the compliant seal 638c reduces the flow of gas out of the gap environment 140 as the two surfaces move pass each other.

Figure 6D:
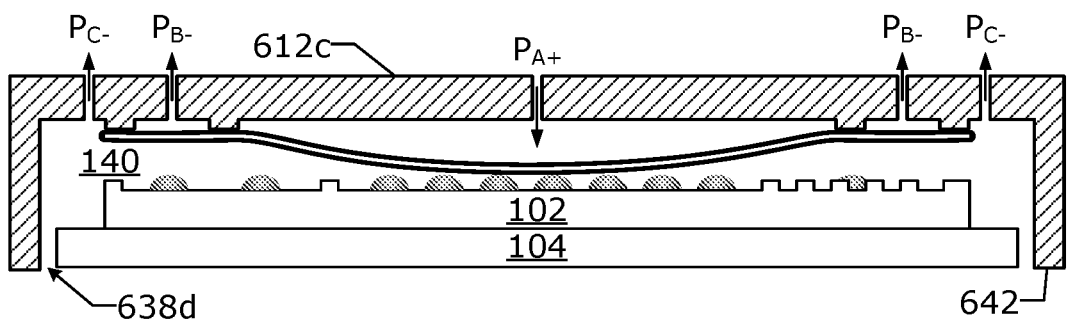

FIG. 6D is an illustration of a portion of an alternative shaping system substantially similar to the portion illustrated in FIG. 6C in which the compliant seal is replaced with a small gap 638d that does not have a compliant seal but whose dimensions provides a controlled resistance to the flow of gas out of the gap environment 140. In an alternative environment, a high molecular weight fluid is in the small gap 38d providing further resistance to the flow of gas out of the gap environment 140.

Figure 6E:
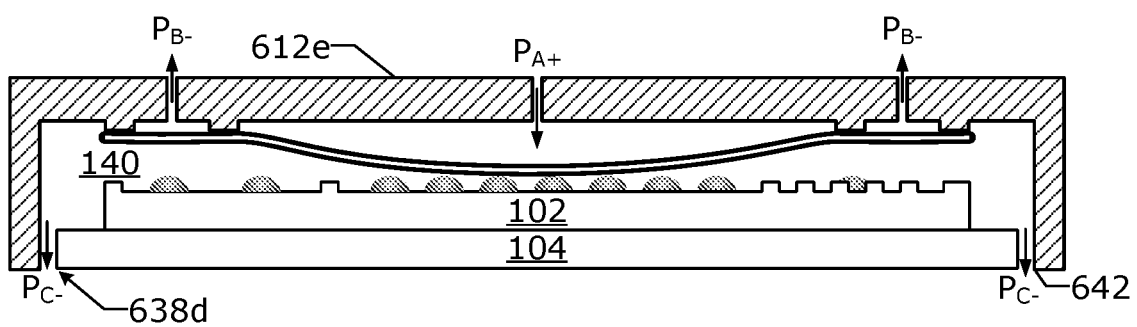

FIG. 6E is an illustration of a portion of an alternative shaping system substantially similar to the portion illustrated in FIG. 6D in which an exterior port 634c is equivalent to the small gap 638d between the substrate chuck 102 and a moving sidewall. In an alternative embodiment, the exterior port 634c is in fluid connection with the small gap 638d. In an embodiment, the negative pressure $P_{C-}$ is supplied via the small gap 638d. In an alternative embodiment, the negative pressure $P_{C-}$ is supplied via one or more ports in the substrate chuck 104.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
holding a template backside of a template with a template chuck, wherein the backside is opposite a shaping surface of the template;
holding a substrate backside of a substrate with a substrate chuck, wherein the substrate backside is opposite a substrate surface, wherein the substrate surface is shaped by the shaping surface of the template;
wherein a template chucking surface of the template chuck is facing a substrate chucking surface of the substrate chuck;
bowing out the template by applying an initial positive pressure to a central portion of the template backside with the template chuck;
initiating contacting of formable material on the substrate with the shaping surface of the template, during a contacting period by moving the substrate chuck and the template chuck towards each other;
reducing, during the contacting period, a pressure in an environment between the substrate and the template from a first pressure to a second pressure, while the template is contacting the formable material;
solidifying the formable material into a film layer on the substrate by exposing the formable material between the template and the substrate to actinic radiation; and
separating the template from the film layer on the substrate by moving the template chuck and the substrate chuck away from each other, thereby forming the film layer on the substrate that reflects the shaping surface of the template.

2. The method according to claim 1, wherein during the contacting period:
an advancing contact line with a contact line velocity is formed by merging of droplets of the formable material on the substrate;
wherein the advancing contact line is at the intersection of the formable material and the template; and
wherein gas is expelled from the region between the template and the substrate at a gas velocity that is greater than the contact line velocity when the pressure in the environment is the second pressure.

3. The method according to claim 2, wherein the gas velocity is greater than the contact line velocity during the contact period.

4. The method according to claim 1, further comprising: depositing the formable material onto the substrate.

5. The method according to claim 4, further comprising: depositing formable material onto the substrate as a plurality of droplets.

6. The method according to claim 4, wherein the formable material is a polymerizable fluid.

7. The method according to claim 1, wherein the template is a superstrate with a shaping surface, and a shaping area of the superstrate is greater than or equal to a device-yielding area of the substrate.

8. The method according to claim 1, wherein a shaping area of the template is less than a device-yielding area of the substrate.

9. The method according to claim 1, during the contacting period, reducing a distance between the substrate chuck and the template chuck while the pressure in the environment between the substrate and the template is reduced from the first pressure to the second pressure.

10. The method according to claim 1, wherein propagation of a contact radius (b) of the formable material is controlled by: a relative position ($Z_h$) of the substrate chuck relative to the template chuck; a positive pressure ($P_{A+}$) applied by the template chuck to the central portion of the back surface of the template; and the pressure in the environment ($P_G$).

11. The method according to claim 10, wherein the propagation of a contact radius (b) is described by equation:

$$\frac{db}{dt} = \frac{\partial b}{\partial P_{A+}} \frac{\partial P_{A+}}{\partial t} + \frac{\partial b}{\partial P_G} \frac{\partial P_G}{\partial t} + \frac{\partial b}{\partial Z_h} \frac{\partial Z_h}{\partial t}.$$

12. A method of manufacturing articles including using the method of shaping the film layer recited in claim 1, the method of manufacturing articles further comprising:
processing the substrate on which the film layer is produced so as to manufacture the articles.

13. A method comprising:
holding a superstrate backside of a superstrate with a superstrate chuck, wherein the backside is opposite a planarization surface of the superstrate;
holding a substrate backside of a substrate with a substrate chuck, wherein the substrate backside is opposite a substrate surface, wherein the substrate surface is planarized by the planarizing surface of the superstrate;
wherein a superstrate chucking surface of the superstrate chuck is facing a substrate chucking surface of the substrate chuck;
bowing out the superstrate by applying an initial positive pressure to a central portion of the superstrate backside with the superstrate chuck;
initiating contacting of formable material on the substrate with the planarizing surface of the superstrate, during a contacting period by moving the substrate chuck and the superstrate chuck towards each other;
reducing, during the contacting period, a pressure in an environment between the substrate and the superstrate from a first pressure to a second pressure, while the superstrate is contacting the formable material;
solidifying the formable material into a planarization layer on the substrate by exposing the formable material between the superstrate and the substrate to actinic radiation; and
separating the superstrate from the planarization layer on the substrate by moving the superstrate chuck and the substrate chuck away from each other, thereby forming the film layer on the substrate that reflects the planarizing surface of the superstrate.

* * * * *